US012255074B2

(12) United States Patent
Huang et al.

(10) Patent No.: US 12,255,074 B2
(45) Date of Patent: Mar. 18, 2025

(54) SELECTIVE ETCHING METHOD AND SEMICONDUCTOR STRUCTURE MANUFACTURED USING THE SAME

(71) Applicant: TAIWAN SEMICONDUCTOR MANUFACTURING COMPANY, LTD., Hsinchu (TW)

(72) Inventors: Kuan-Da Huang, Hsinchu (TW); Chun-Fu Kuo, Hsinchu (TW); Yi-Hsing Yu, Hsinchu (TW); Li-Te Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 343 days.

(21) Appl. No.: 17/836,452

(22) Filed: Jun. 9, 2022

(65) Prior Publication Data
US 2023/0402287 A1    Dec. 14, 2023

(51) Int. Cl.
*H01L 21/308*    (2006.01)
*H01L 21/02*    (2006.01)
*H01L 21/3065*    (2006.01)
*H01L 21/8234*    (2006.01)
*H01L 21/8238*    (2006.01)
*H01L 27/092*    (2006.01)
*H01L 29/66*    (2006.01)
*H01L 29/78*    (2006.01)
*H01L 29/06*    (2006.01)
*H01L 29/417*    (2006.01)
*H01L 29/423*    (2006.01)

(52) U.S. Cl.
CPC .... *H01L 21/3083* (2013.01); *H01L 21/02057* (2013.01); *H01L 21/3065* (2013.01); *H01L 21/823431* (2013.01); *H01L 21/823821* (2013.01); *H01L 27/0924* (2013.01); *H01L 29/66545* (2013.01); *H01L 29/66795* (2013.01); *H01L 29/6681* (2013.01); *H01L 29/785* (2013.01); *H01L 29/0657* (2013.01); *H01L 29/41775* (2013.01); *H01L 29/42392* (2013.01)

(58) Field of Classification Search
None
See application file for complete search history.

(56) References Cited

U.S. PATENT DOCUMENTS

2020/0127119 A1\*   4/2020   Lin ............... H01L 21/31116
2020/0176320 A1\*   6/2020   Chen ............. H01L 21/823431

OTHER PUBLICATIONS

H. Xiao, Introduction to Semiconductor Manufacturing Technology, SPIE Press, section 9.4.4, pp. 333-334. (Year: 2012).\*

\* cited by examiner

*Primary Examiner* — Jiong-Ping Lu
(74) *Attorney, Agent, or Firm* — Birch, Stewart, Kolasch & Birch, LLP

(57) ABSTRACT

A method for manufacturing a semiconductor structure includes forming a semiconductor portion which has an exposed region; forming two fin sidewalls which are disposed at two opposite sides of the exposed region of the semiconductor portion, and which include a dielectric material; and performing an etching process such that the exposed region of the semiconductor portion is etched away to form a recess while a protection layer is formed to protect each of the fin sidewalls during the etching process. Other methods for manufacturing the semiconductor structure are also disclosed.

20 Claims, 22 Drawing Sheets

SELECTIVE ETCHING METHOD AND SEMICONDUCTOR STRUCTURE MANUFACTURED USING THE SAME

BACKGROUND

Transistors are key active components in modern integrated circuits (IC). With rapid development of semiconductor technology, critical dimension (CD) of transistors keeps shrinking and various three-dimensional (3D) transistor structures are springing up, making it possible to integrate a large number of transistors per unit area. Meanwhile, a distance between two adjacent ones of the transistors is reduced as well, so an isolation structure located between the adjacent transistors become more critical. Therefore, an isolation structure for advanced node transistors and/or a method for manufacturing the same is in continuous development.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
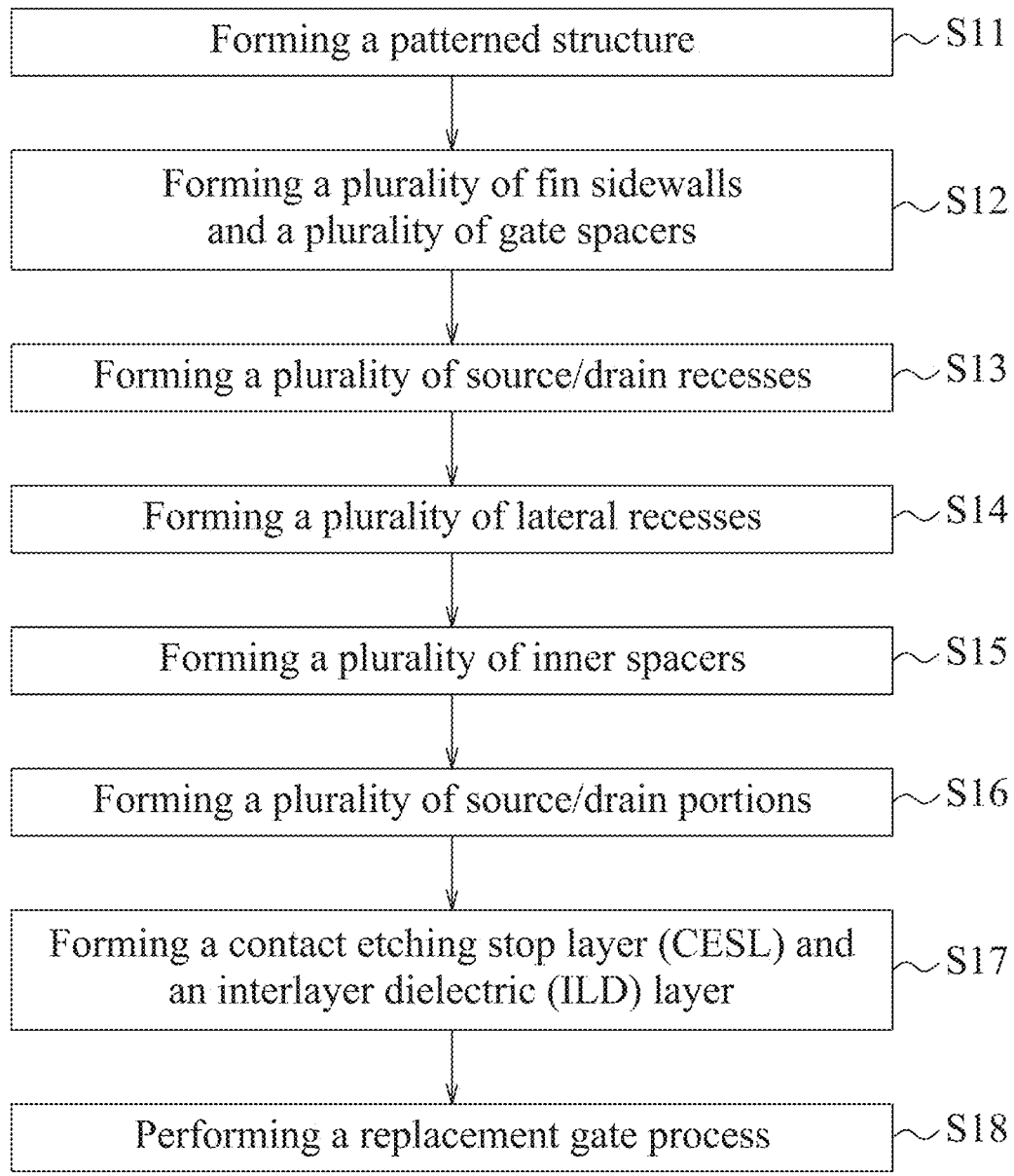
FIG. 1 is a flow diagram illustrating a method for manufacturing a semiconductor structure in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "top," "bottom," "upper," "lower," "over," "beneath," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In advanced technology nodes, in order to avoid merging of a source/drain portion of one of transistors with a source/drain portion of an adjacent one of the transistors (i.e., source/drain merging issue), an isolation structure, such as fin sidewalls, a dummy fin, or a hybrid fin, is often disposed between the source/drain portions of two adjacent ones of the transistors. However, along with the dimensional shrinkage of the transistors, a spacing between two adjacent ones of the source/drain portions becomes smaller to receive the isolation structure. Therefore, fin sidewalls, which occupy less space, become more useful, and a method for obtaining relatively high fin sidewalls in a three-dimensional transistor has received great attention. The present disclosure is directed to a selective etching method for manufacturing a semiconductor structure including relatively high fin sidewalls. The semiconductor structure may be applied to fin-type FETs (FinFET), multi-gate FETs (e.g., gate-all-around FETs (GAAFET), multi-bridge channel FETs (MBCFET), fork-sheet FETs, etc.), other three-dimensional transistors, or other suitable devices. The method of the present disclosure is extremely advantageous for the multi-gate FETs, and may be applied to the FinFETs, as well.

FIG. 1 is a flow diagram illustrating a method 10 for manufacturing a semiconductor structure (for example, the semiconductor structure 50 shown in FIG. 22) in accordance with some embodiments. FIGS. 2 to 23 illustrate schematic views of intermediate stages of the method 10 in accordance with some embodiments. Some repeating structures are omitted in FIGS. 2 to 23 for the sake of brevity.

Figure 2:
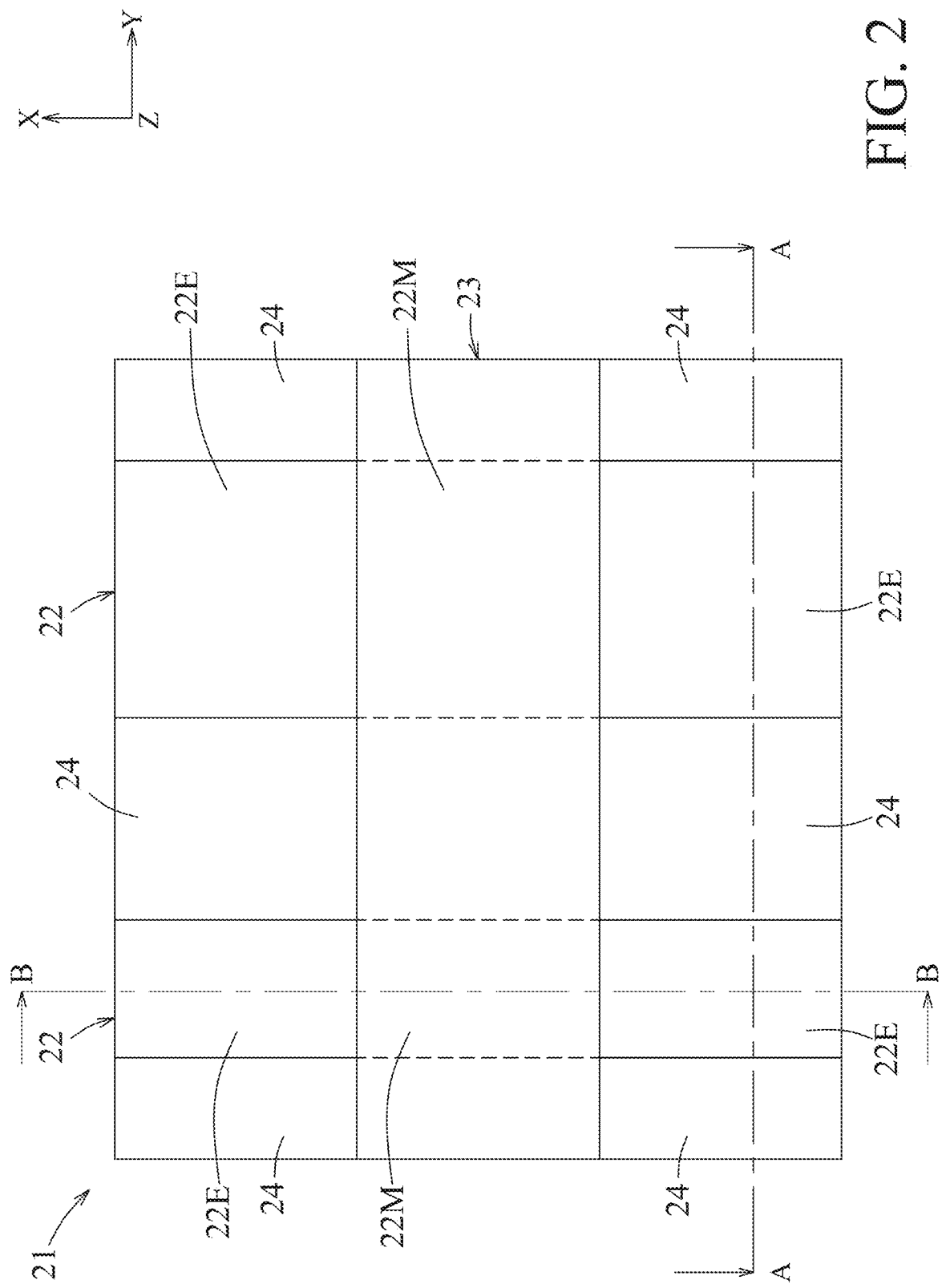
FIGS. 2 to 23 illustrate schematic views of intermediate stages of the method depicted in FIG. 1 in accordance with some embodiments.
Figure 3:
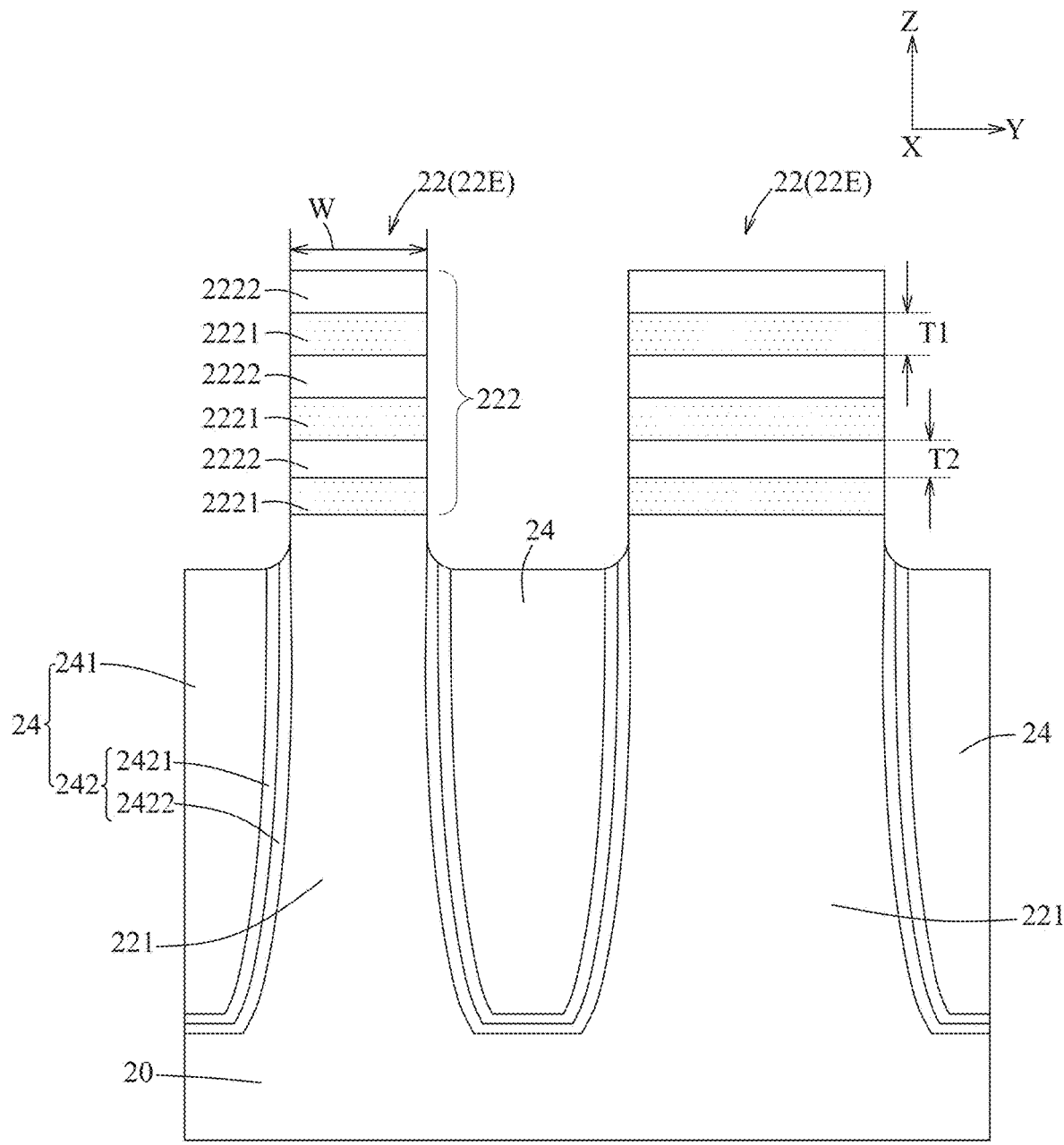
Figure 4:
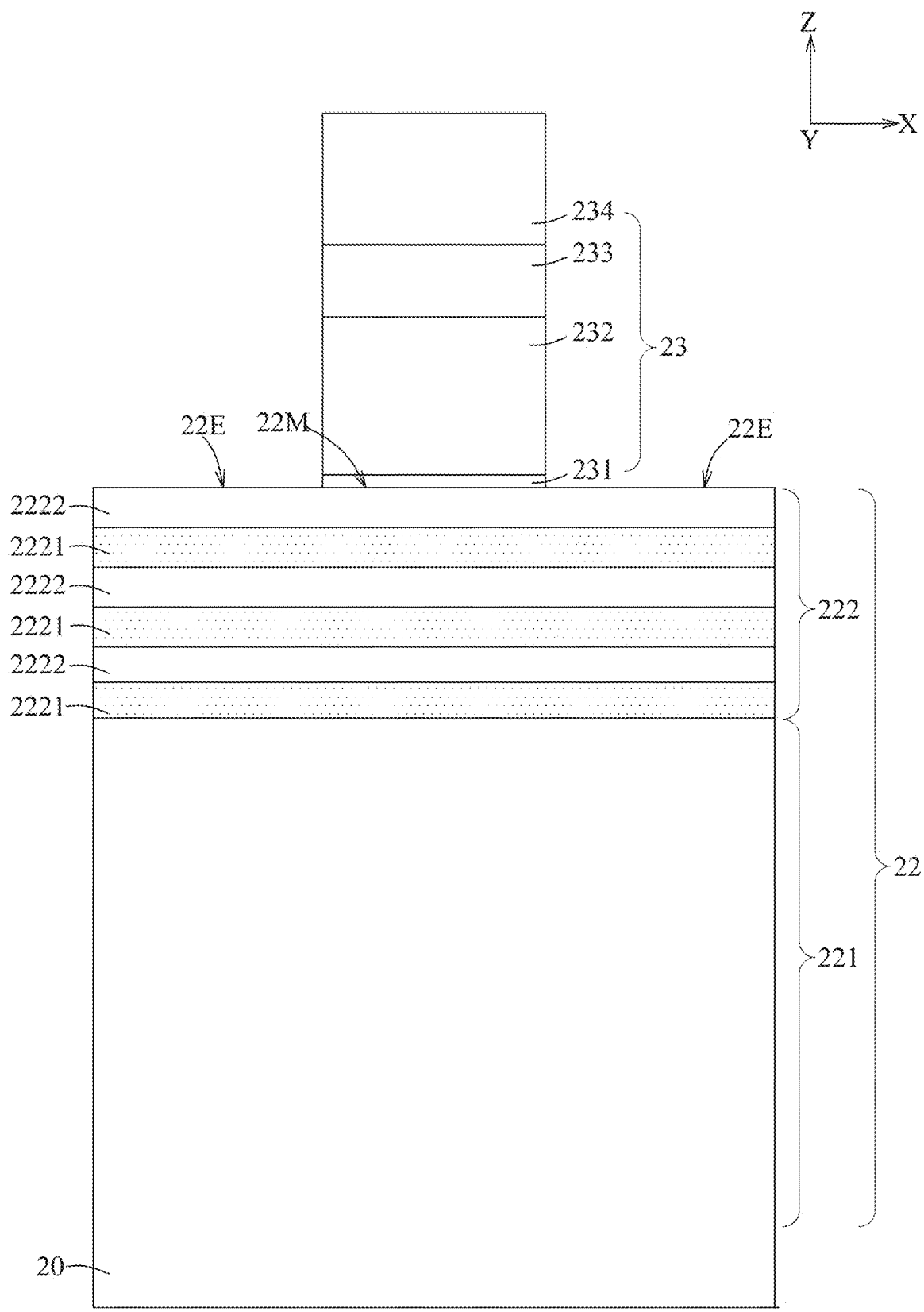
Figure 5:
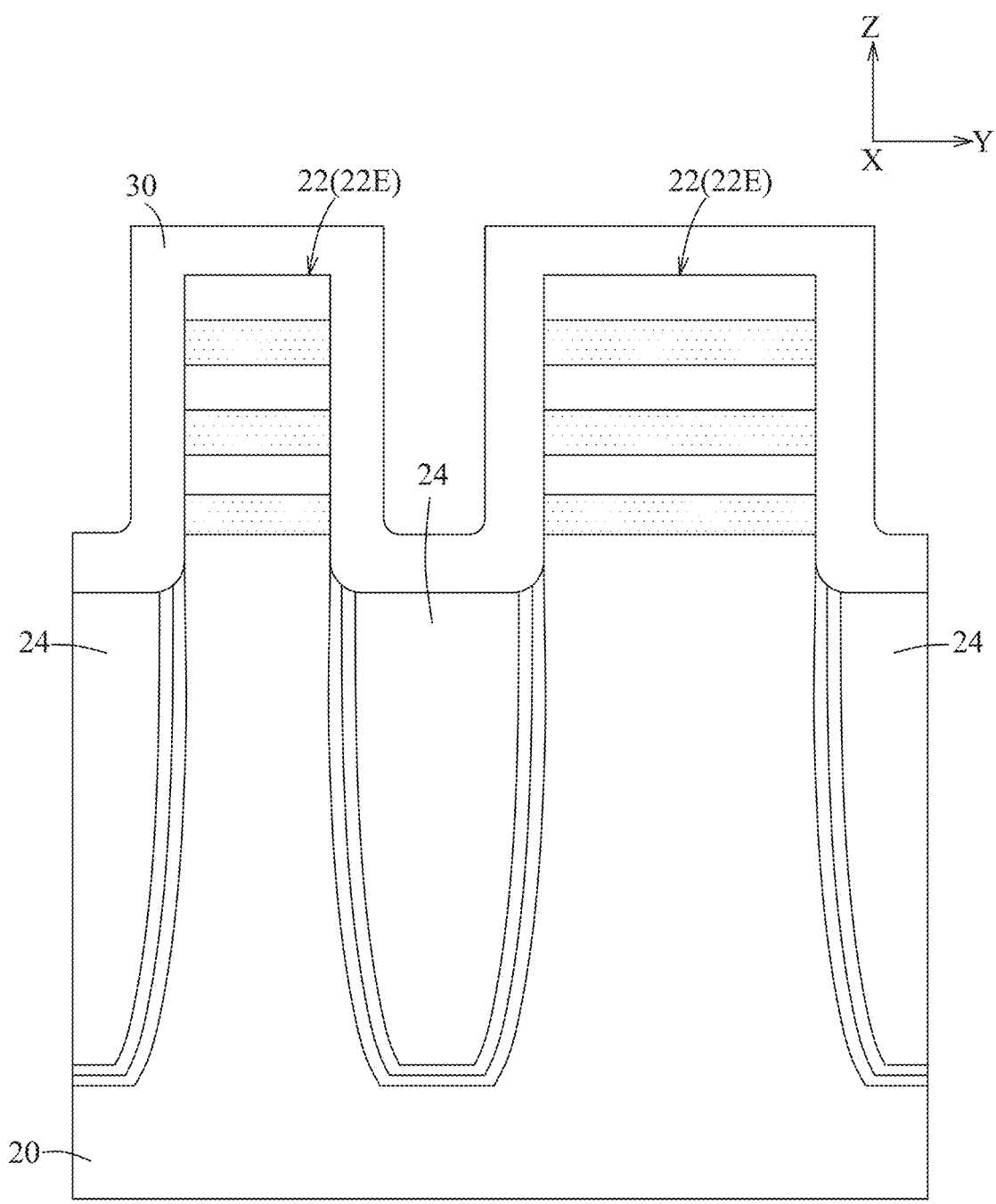
Figure 6:
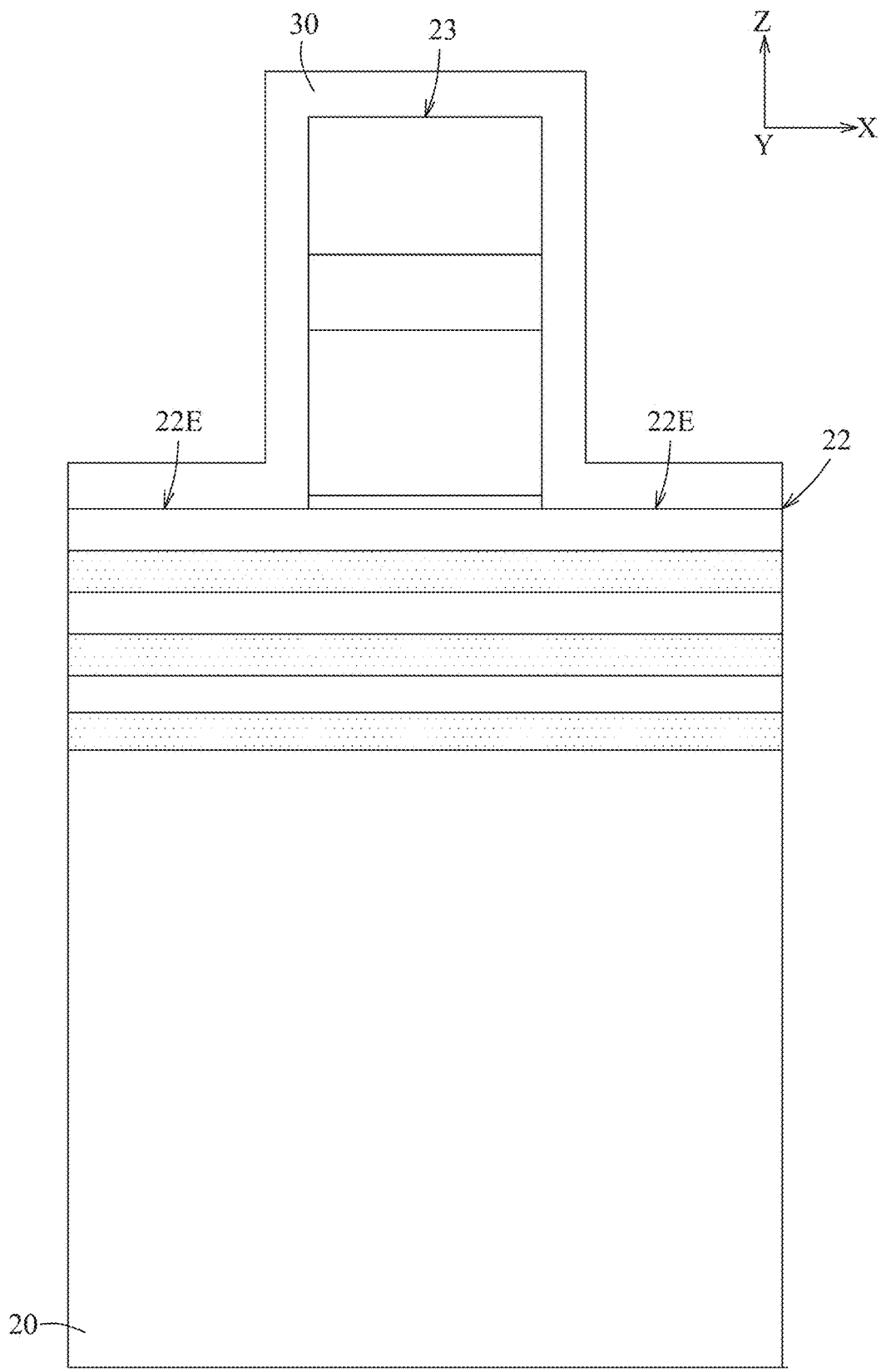

FIG. 2 is a schematic top view of a patterned structure 21 in accordance with some embodiments. FIG. 3 is a schematic sectional view of the patterned structure 21 taken along line A-A of FIG. 2. FIG. 4 is a schematic sectional view of the patterned structure 21 taken along line B-B of FIG. 2.

Referring to FIG. 1 and the examples illustrated in FIGS. 2 to 4, the method 100 begins at step S11 where the patterned structure 21 is formed. The patterned structure 21 includes a semiconductor substrate 20, and a plurality of semiconductor portions 22 (two of which are shown in FIGS. 2 and 3). As shown in FIG. 2, the semiconductor portions 22 are elongated in an X direction, and are spaced apart from each other in a Y direction transverse to the X direction. In some embodiments, the semiconductor portions 22 may have a width (W) different from each other in the Y direction, as shown in FIG. 3. In other not shown embodiments, the widths (W) of the semiconductor portions 22 may be substantially the same.

Figure 22:
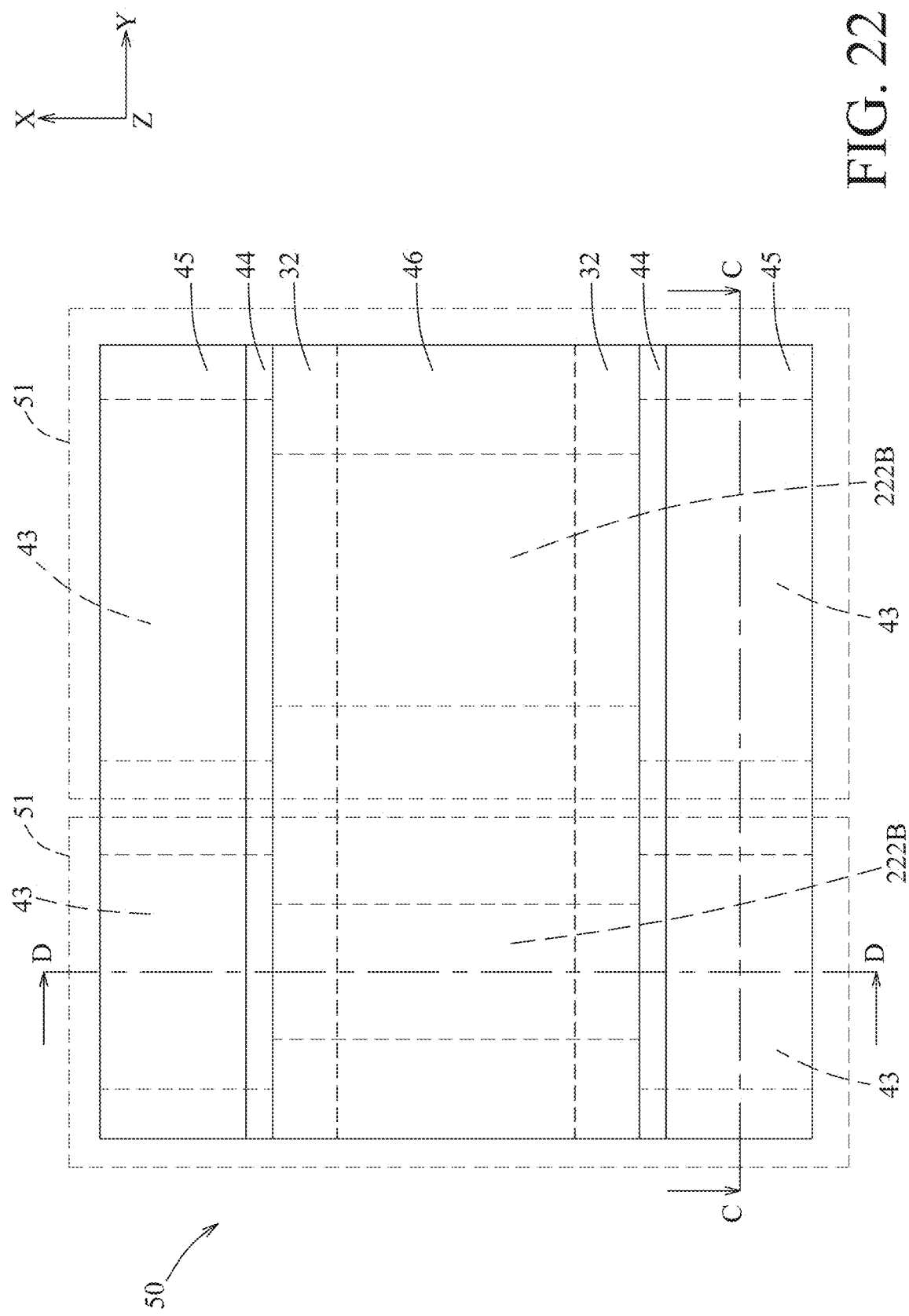
Figure 23:
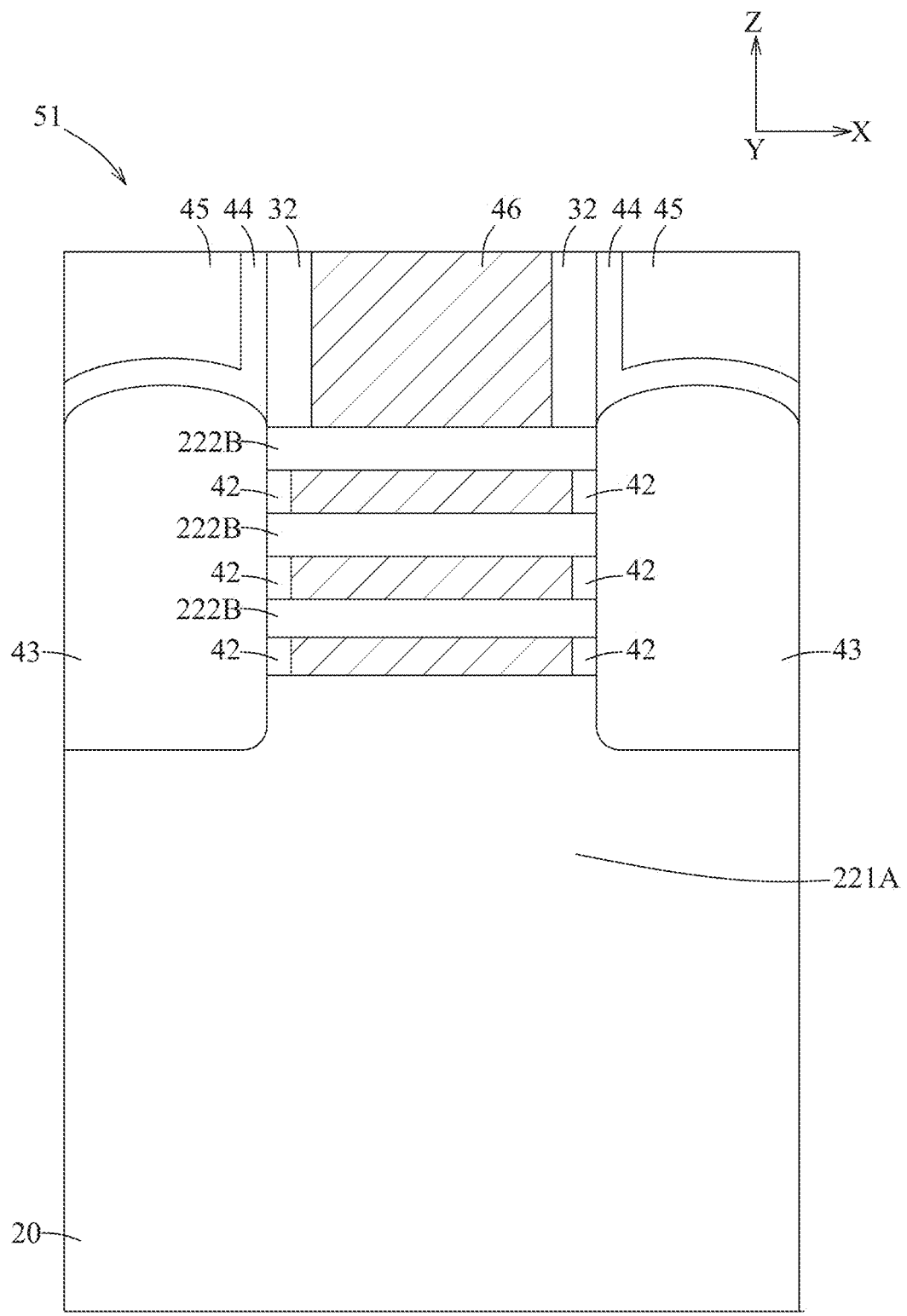

It should be noted that although the method 10 is exemplified using a method for manufacturing a GAA structure including a plurality of GAA devices (two of which are exemplified by semiconductor devices 51 shown in FIG. 23), the method 10 may be used for manufacturing other suitable structures. In some embodiments, the number of the semiconductor portions 22 or the number of the semiconductor devices 51 respectively formed from the semiconductor portions 22 can be varied according to the circuit design of the semiconductor structure 50 (see FIG. 22).

In some embodiments, the semiconductor substrate 20 may be made of elemental semiconductor materials, such as crystalline silicon, diamond, or germanium; compound semiconductor materials, such as silicon carbide, gallium arsenic, indium arsenide, or indium phosphide; or alloy semiconductor materials, such as silicon germanium, silicon germanium carbide, gallium arsenic phosphide, or gallium indium phosphide. The material for forming the semiconductor substrate 21 may be doped with p-type impurities or n-type impurities, or undoped. In addition, the semiconductor substrate 20 may be a bulk silicon substrate, a siliconon-insulator (SOI) substrate, or a germanium-on-insulator (GOI) substrate. Other suitable materials for the semiconductor substrate 20 are within the contemplated scope of the present disclosure.

In some embodiments, as shown in FIG. 3, each of the semiconductor portions 22 has a fin shape, and may be referred to as a semiconductor fin. Each of the semiconductor fins 22 includes a stack portion 222 and a lower portion 221 disposed between the semiconductor substrate 20 and the stack portion 222. The stack portion 222 includes a plurality of sacrificial layers 2221 and a plurality of channel layers 2222 disposed to alternate with the sacrificial layers 2221 in a Z direction transverse to both the X and Y directions. One of the sacrificial layers 2221 and one of the channel layers 2222 may be referred to as a stack unit. In some embodiments, the number of the stack unit may range from about two to four.

In some embodiments, the lower portion 221 may be made from a material the same as or different from that of the semiconductor substrate 20. In some embodiments, the channel layers 2222 may be made from a material the same as or different from that of the semiconductor substrate 20. The sacrificial layers 2221 are made from a material which is different from that of the channel layers 2222, and which can be selectively removed with respect to the material of the channel layers 2222. In some embodiments, the channel layers 2222 include a silicon-based material, and the sacrificial layers 221 include a silicon germanium-based material which includes from about 10 atomic percent germanium to about 40 atomic percent germanium. Since suitable materials for elements 221, 2221, 2222 of the semiconductor fins 22 are similar to those for the semiconductor substrate 20, the details thereof are omitted for the sake of brevity. In some embodiments, each of the sacrificial layers 2221 may have a thickness (T1) ranging from about 3 nm to about 7 nm. In some embodiments, each of the channel layers 2222 may have a thickness (T2) ranging from about 7 nm to about 11 nm. In some embodiments, the width (W) of each of the semiconductor fins 22 ranges from about 10 nm to about 80 nm.

In some not shown embodiments, when the method 10 is used for manufacturing a FinFET structure including a plurality of FinFET devices, the semiconductor portions 22 in position corresponding to the semiconductor fins 22 for forming the FinFET devices are each a semiconductor fin which includes a single channel layer, and a most distal region of the semiconductor fin relative to the semiconductor substrate 20 may serve as the single channel layer. The semiconductor fin may be made from a material the same as or different from that of the semiconductor substrate 20. Since suitable materials for the semiconductor fin are similar to those for the semiconductor substrate 20, the details thereof are omitted for the sake of brevity.

In some embodiments, as shown in FIGS. 2 and 4, the patterned structure 21 further includes a dummy gate portion 23 extending in the Y direction over the semiconductor portions 22 such that each of the semiconductor fins 22 has two regions 22E exposed from the dummy gate portion 23. The two exposed regions 22E are located at two sides of the dummy gate portion 23 which are opposite to each other in the X direction. In some embodiments, the dummy gate portion 23 may include a dummy gate dielectric 231, a dummy gate electrode 232, a polish stop layer 233, and a hard mask 234. The dummy gate dielectric 231 is disposed on a middle region 22M of each of the semiconductor fins 22, where the middle region 22M is disposed between the two exposed regions 22E. The dummy gate electrode 232, the polish stop layer 233, and the hard mask 234 are sequentially disposed on the dummy gate dielectric 231 opposite to the middle region 22M. In some embodiments, each of the hard mask 234 and the polish stop layer 233 may independently include silicon nitride, silicon oxide, silicon oxynitride, or combinations thereof, the dummy gate electrode 232 may include polycrystalline silicon, single crystalline silicon, amorphous silicon, or combinations thereof, and the dummy gate dielectric 231 may include silicon oxide, silicon nitride, silicon oxynitride, high dielectric constant (k) materials, or combinations thereof. Other suitable materials for the dummy gate portion 23 are within the contemplated scope of the present disclosure.

In some embodiments, as shown in FIGS. 2 and 3, the patterned structure 21 further includes two isolations portions 24 which are located respectively at two opposite sides of the lower portion 221 of each of the semiconductor fins 22 so as to isolation two adjacent ones of the semiconductor fins 22, and which are opposite to each other in the Y direction. In some embodiments, each of the isolation portions 24 includes a main body 241, and a liner 242 disposed between the main body 241 and two adjacent ones of the lower portions 221. In some embodiments, the main body 241 of each of the isolation portions 24 may be a portion of a shallow trench isolation (STI), a deep trench isolation (DTI), or other suitable structures, and may be made of an oxide material (for example, silicon oxide), a nitride material (for example, silicon nitride), or a combination thereof. In some embodiments, the liner 242 may include a first sub-layer 2421 and a second sub-layer 2422 that is disposed on the first sub-layer 2421 and that is distal from the main body 241 so as to form a bi-layered structure. In some embodiments, the first sub-layer 2421 is made of silicon, and the second sub-layer 2422 is made of silicon oxide. In some not shown embodiments, the liner 242 may be configured as a single layer structure. Other suitable materials for the isolation portions 24 are within the contemplated scope of the present disclosure.

In some embodiments, the patterned structure 21 may be formed by (i) patterning a substrate and a stack (not shown) formed thereon to form the semiconductor fins 22 on the semiconductor substrate 20 (the substrate is patterned into the semiconductor substrate 20 and a lower portion 221 of each of the semiconductor fins 22, and the stack is patterned into the stack portion 222 of each of the semiconductor fins 22), (ii) forming an isolation layer over the semiconductor substrate 20 and the semiconductor fins 22 followed by a planarization process, for example, but not limited to, chemical mechanism polishing (CMP), to form two isolation regions at two opposite sides of each of the semiconductor fins 22, (iii) recessing the isolation regions to form the isolation portions 24 so as to expose the stack portion 222 of each of the semiconductor fins 22 and an upper part of the lower portion 221 of each of the semiconductor fins 22, and (iv) forming the dummy gate portion 23 over the semiconductor fins 22 to expose the exposed regions 22E of the semiconductor fins 22 from the dummy gate portion 23. In other words, each of the exposed regions 22E of the semiconductor fins 22 includes a region of the stack portion 222 and a region of the upper part of the lower portion 221. Other suitable processes for forming the patterned structure 21 are within the contemplated scope of the present disclosure.

Figure 7:
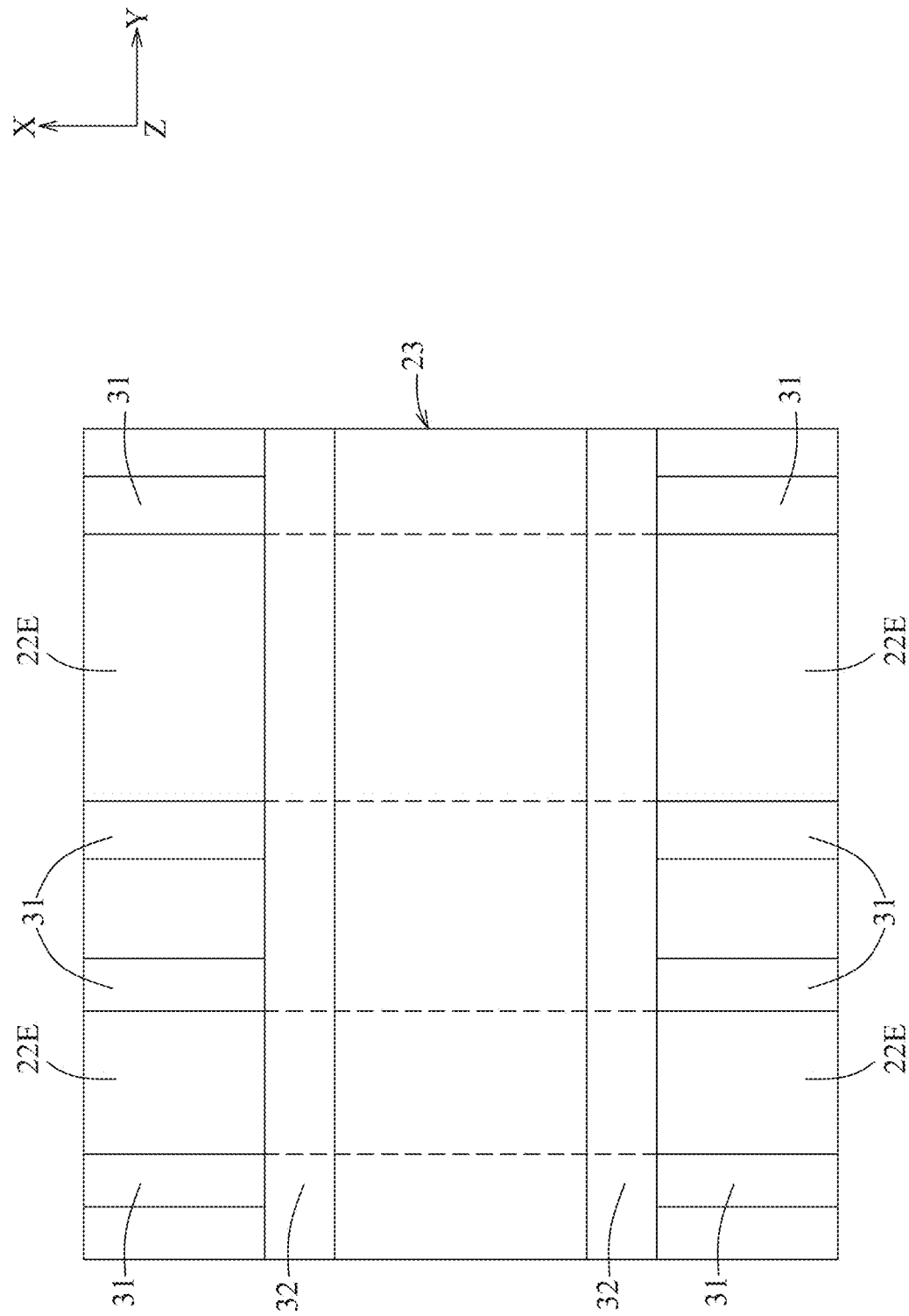
Figure 8:
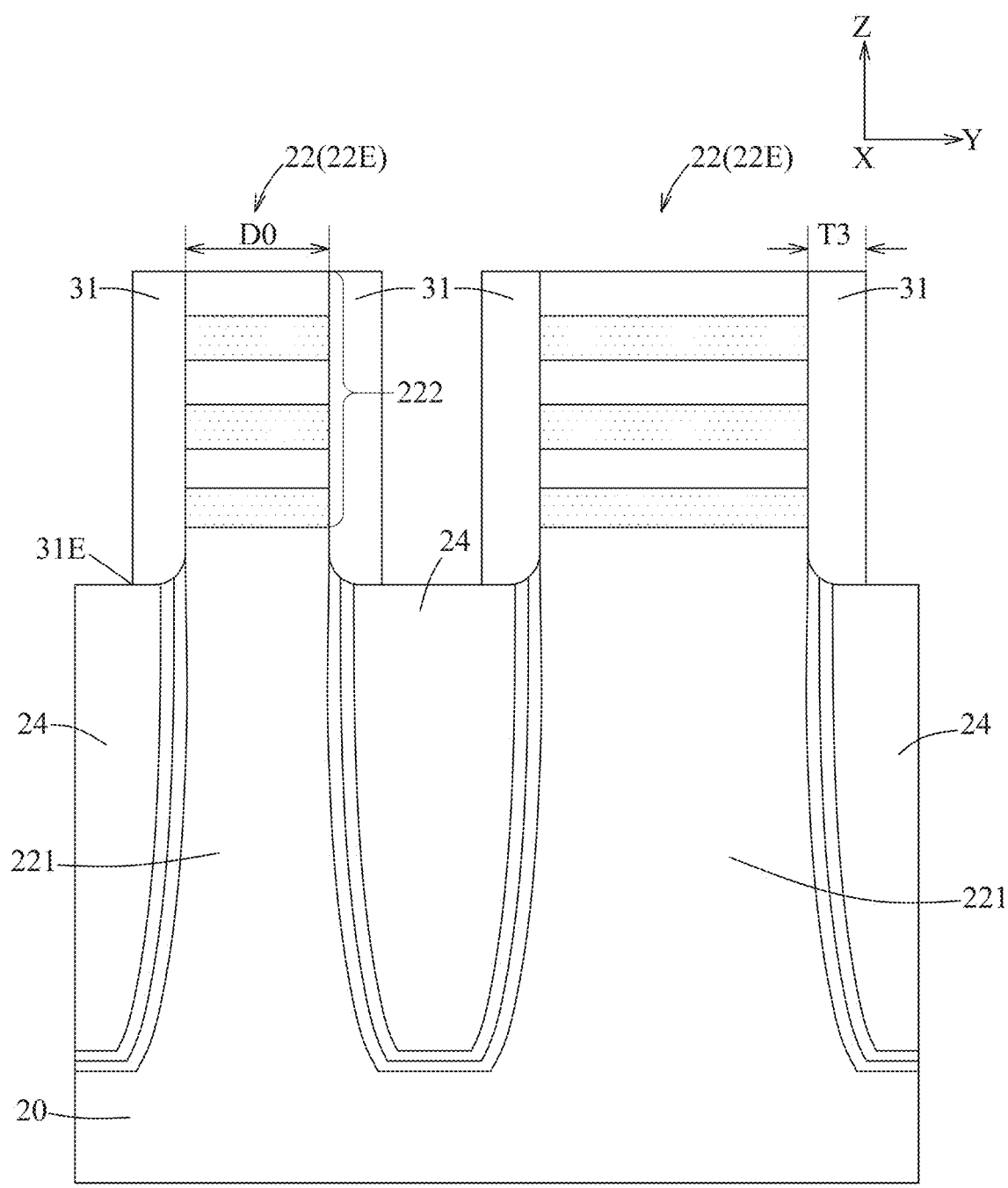
Figure 9:
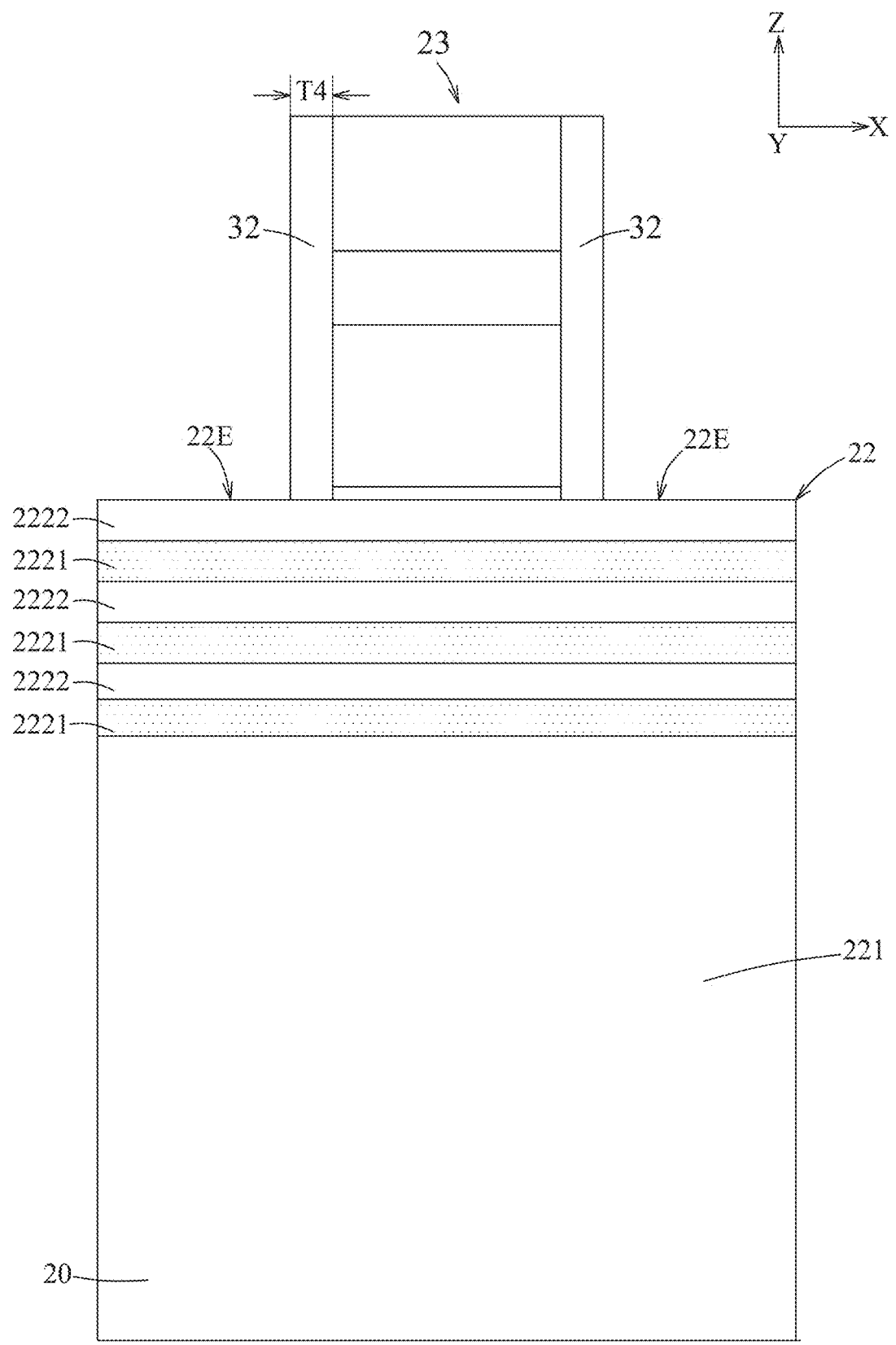

Referring to FIG. 1 and the examples illustrated in FIGS. 7 to 9, the method 10 proceeds to step S12, where two fin sidewalls 31 are respectively formed at two opposite sides of each of the exposed regions 22E of the semiconductor fins 22 in the Y direction, and two gate spacers 32 are respectively formed at two opposite sides of the dummy gate portion 23 in the X direction. FIGS. 7 to 9 are views similar to those of FIGS. 2 to 4, respectively, but illustrating the structures after step S12.

In some embodiments, as shown in FIG. 8, the two fin sidewalls 31 are respectively formed on the isolation portions 24 at two opposite sides of each of the semiconductor fins 22 so as to be located at two opposite sides of each of the exposed regions 22E of the semiconductor fins 22. A distance (D0) between the fin sidewalls 31 in the Y direction is dependent on the width (W) of the corresponding semiconductor fin 22. In some embodiments, the distance (D0) ranges from about 10 nm to about 80 nm.

In some embodiments, the two fin sidewalls 31 for each of the exposed regions 22E and the two gate spacers 32 for the dummy gate portion 23 may be formed by conformally depositing a dielectric layer 30 (see FIGS. 5 and 6) over the structure shown in FIGS. 2 to 4 using, for example, chemical vapor deposition (CVD), atomic layer deposition (ALD), or other suitable deposition techniques, followed by an anisotropic dry etching until portions of the dielectric layer 30, which are respectively formed on upper surfaces of the exposed regions 22E, an upper surface of the dummy gate portion 23 and upper surfaces of the isolation portions 24, are removed such that the two fin sidewalls 31 are selectively formed at the two opposite sides of each of the exposed regions 22E, and the two gate spacers 32 are selectively formed at the two opposite sides of the dummy gate portion 23.

In some embodiments, the dielectric layer 30 may include a nitride-based material. In some embodiments, for example, the dielectric layer 30 may be made of silicon nitride (SiN), silicon oxynitride (SiON), silicon carbonnitride (SiCN), silicon oxycarbonnitride (SiOCN), but is not limited thereto. Other materials suitable for forming the dielectric layer 30 (i.e., materials for forming the fin sidewalls 31 and the gate spacers 32) are within the contemplated scope of the present disclosure. In some embodiments, each of the fin sidewalls 31 may have a thickness (T3) ranging from about 6 nm to about 12 nm. In some embodiments, each of the gate spacers 32 may have a thickness (T4) ranging from about 6 nm to about 12 nm.

Figure 11:
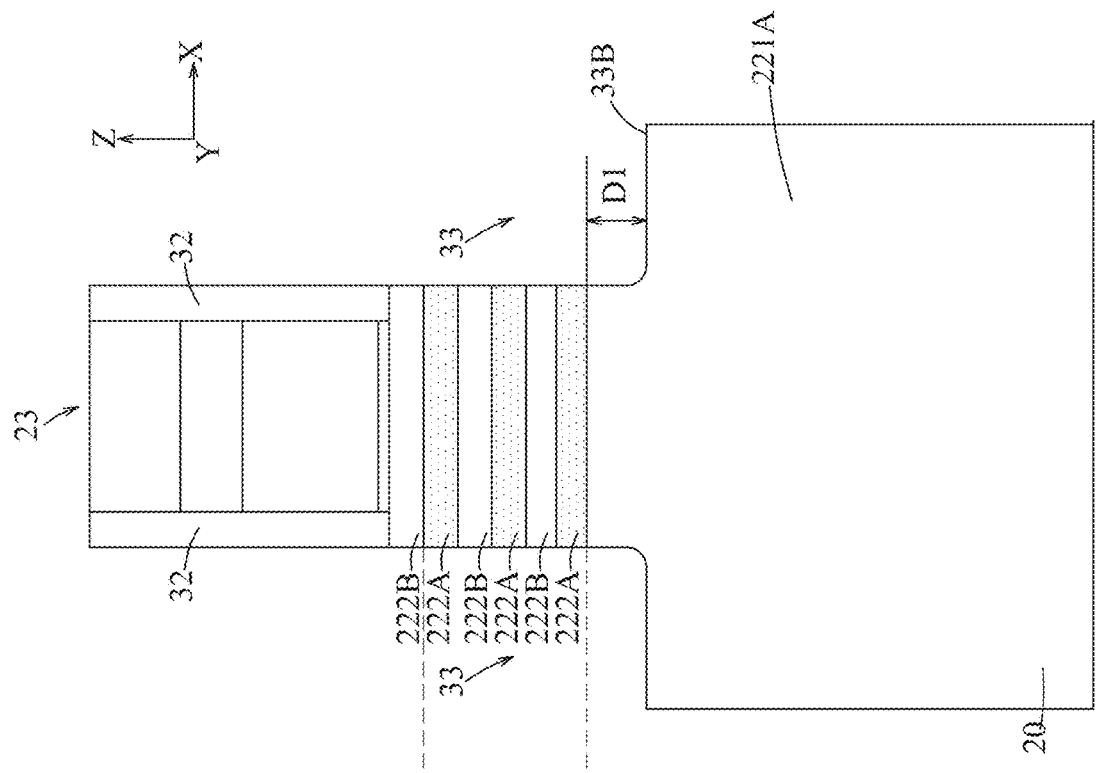
Figure 10:
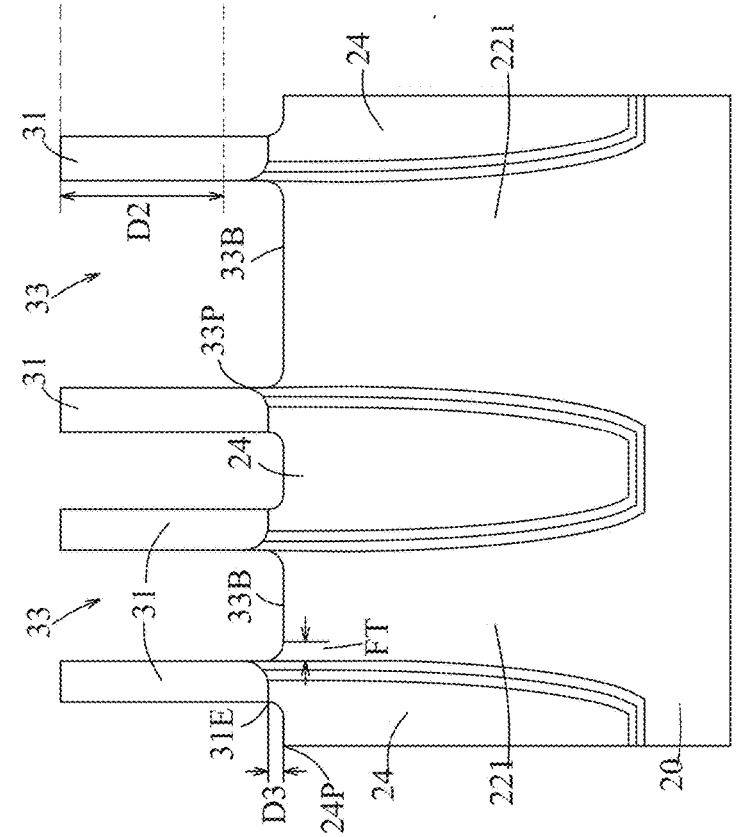

Referring to FIG. 1 and the examples illustrated in FIGS. 10 and 11, the method 10 proceeds to step S13, where the exposed regions 22E (see FIGS. 8 and 9) of each of the semiconductor fins 22 are etched away to form source/drain recesses 33. FIGS. 10 and 11 are views similar to those of FIGS. 8 and 9, respectively, but illustrating the structures after step S13.

FIGS. 12 to 15 illustrate schematic views of intermediate stages of step S13 in accordance with some embodiments. For purposes of simplicity and clarify, since the exposed regions 22E of the semiconductor fins 22 shown in FIG. 8 are subjected to substantially the same treatments/processes so as to have similar configurations in the followings, one of the exposed regions 22E (which is also referred by "22E1") and upper portions of the fin sidewalls 31 (which are also referred by "31U" and which are located at the opposite sides of the exposed region 22E1) will be described below in more detail with reference to FIGS. 12 to 15. In some embodiments, step S13 includes sub-steps S131 and S132.

Figure 12:
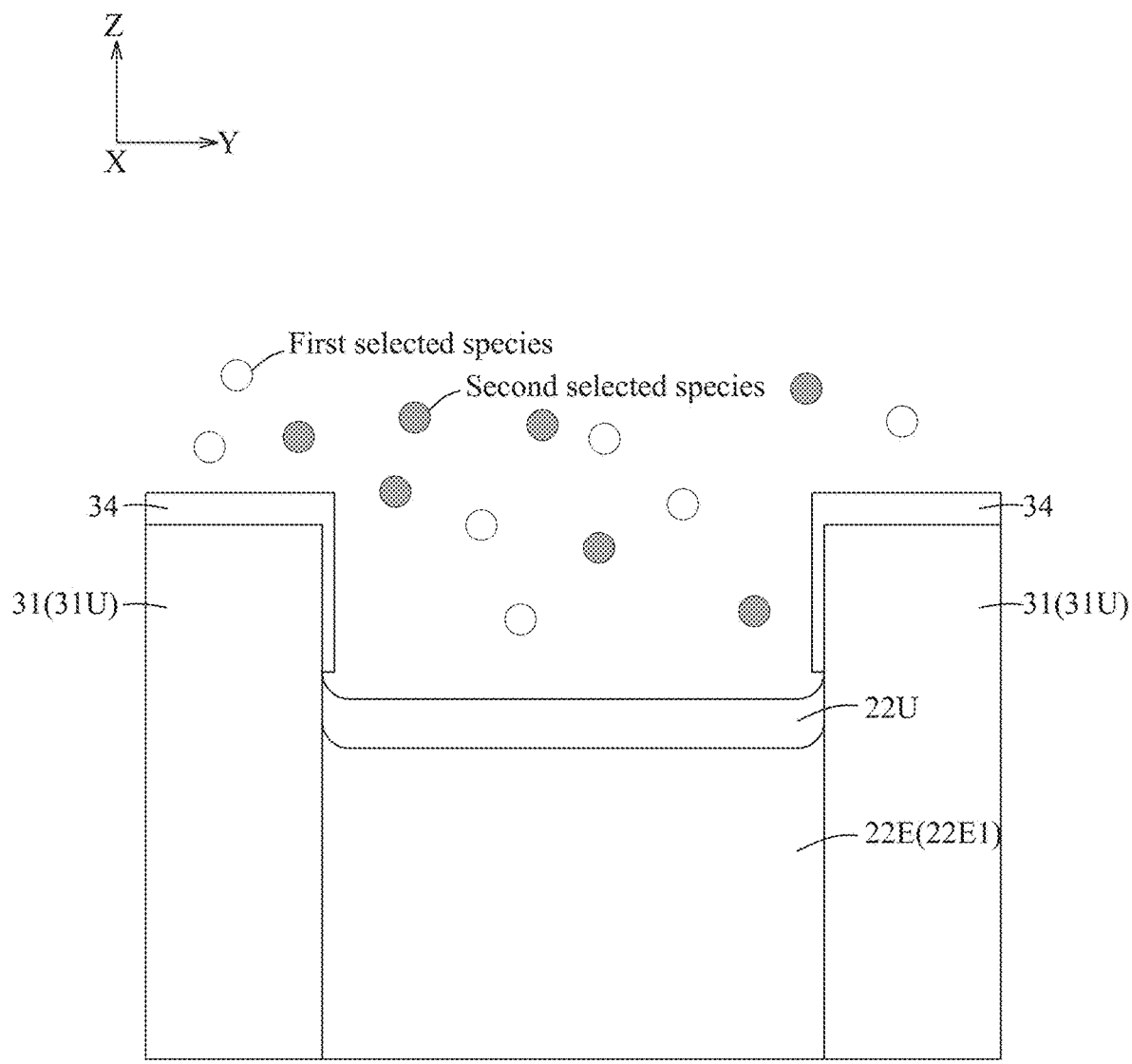
Figure 13:
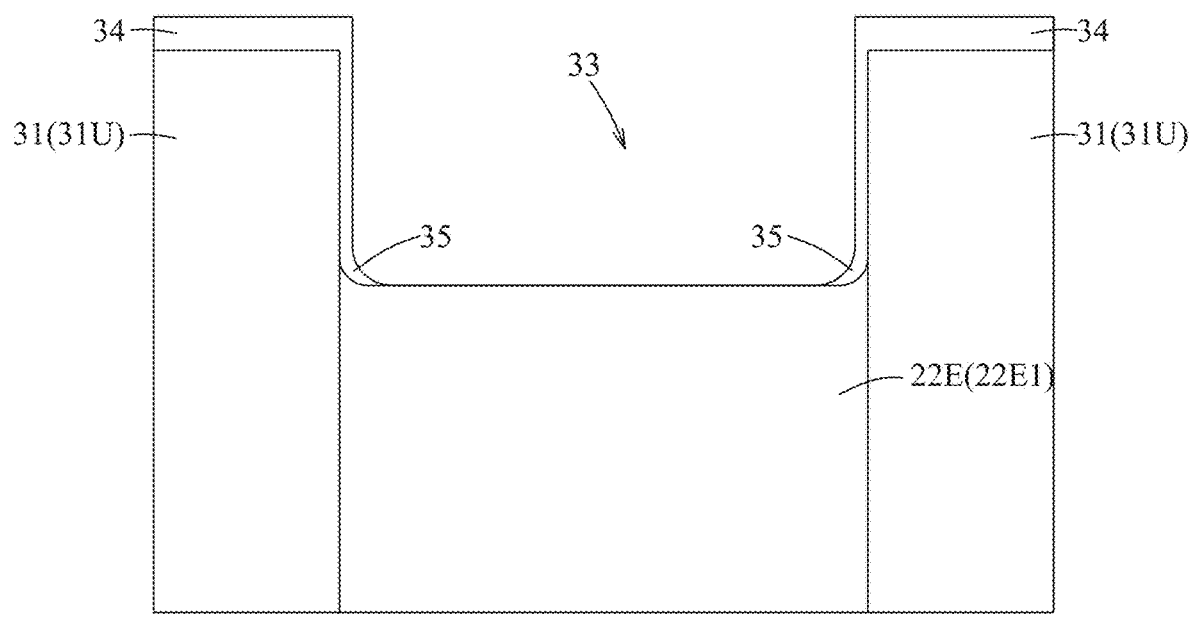

In sub-step S131, as shown in FIGS. 12 and 13, an etching process is performed such that an upper part 22U of the exposed region 22E1 is etched away while each of the upper portions of the fin sidewalls 31U is protected by a protection layer 34.

In some embodiments, first selected species and second selected species are used in the etching process. The second selected species are provided to selectively react with the upper portions of the fin sidewalls 31U so as to form the protection layer 34 on each of the upper portion of the fin sidewalls 31U, and are less likely to react with the exposed region 22E1. In contrast, the first selected species are provided for removal of the exposed region 22E1. Since each of the upper portions of the fin sidewalls 31U is protected by the corresponding protection layer 34, the first selected species are less likely to react with the upper portions of fin sidewalls 31U, and thus selectively react with the elements in the upper part 22U of the exposed region 22E1. In some embodiments, the upper part 22U of the exposed region 22E1 is transformed into a volatile compound which can be naturally vaporized under a predetermined temperature. In some embodiments, the etching process may be performed at a temperature ranging from about 0° C. to about 150° C. In some embodiments, the first selected species is a first plasma, and the second selected species is a second plasma.

After sub-step S131, as shown in FIG. 13, the upper part 22U (see FIG. 12) of the exposed region 22E1 is removed, the source/drain recess 33 becomes deeper, while the upper portions of the fin sidewalls 31U are substantially intact owing to protection of the protection layer 34 disposed thereon. Furthermore, some byproducts 35 may be inevitably produced during the etching process, and remain at corners of the source/drain recess 33. In some embodiments, the byproducts 35 may be a product generated by reacting the first selected species and the exposed region 22E1. In some embodiments, the byproducts 35 may result from the non-reacted second selected species.

In some embodiments, the etching process may be performed using a plasma etching process, and the first and second selected species may be generated by a plasma generator, for example, but not limited to, an inductively-coupled plasma (ICP) generator, a capacitively-coupled plasma (CCP) generator, or an electron cyclotron resonance (ECR) plasma generator. Other plasma generators suitable for generating the first and second selected species are within the contemplated scope of the present disclosure.

In some embodiments, the etching process may be performed without applying a bias voltage (i.e., the bias voltage applied to the structure shown in FIG. 12 is zero), and thus the etching process is mainly proceeds through a selective chemical reaction rather than an ion bombardment, thereby reducing damage of the exposed region 22E1. In some embodiments, the etching process may be performed at a pressure ranging from about 1 mTorr to about 1 Torr.

In some embodiments, a first precursor gas for generating the first selected species (e.g., the first plasma) may include a halogen-bearing gas, such as a fluorine (F)-bearing gas, chlorine (Cl)-bearing gas, bromine (Br)-bearing gas, or combinations thereof. For example, the first precursor gas may include nitrogen fluoride ($NF_x$), hydrofluorocarbons ($C_xH_yF_z$), chlorine ($Cl_2$), hydrogen bromide (HBr), or combinations thereof. Other gases suitable for generating the first selected species to remove the exposed region 22E1 are within the contemplated scope of the present disclosure. The first selected species thus generated may include halogen radicals, halogen ions, or combinations thereof. For example, the first selected species may include fluorine radicals (which can be represented as —F), chlorine radicals (which can be represented as —Cl), bromine radicals (which can be represented as —Br), fluorine ions, chlorine ions, bromine ions, or combinations thereof, but not limited thereto. In the case that the exposed region 22E1 includes a silicon-based material, the volatile compound may include silicon chloride, silicon fluoride, silicon bromide, or combinations thereof.

In some embodiments, a second precursor gas for generating the second selected species (e.g., the second plasma) includes halides (for example, but not limited to, metal fluoride, metal chloride, metal bromide, metalloid fluoride, metalloid chloride, metalloid bromide), transition metal alkyl complexes, transition metal alkyl halides (for example, but not limited to, metal dimethyl chloride, metal trimethyl chloride, metal dimethyl fluoride, metal trimethyl fluoride, metal dimethyl bromide, metal trimethyl bromide), or combinations thereof. The metal or metalloid elements for forming the abovementioned compound include titanium, zirconium, hafnium, boron, tantalum, aluminum, tungsten, yttrium, vanadium, niobium, copper, but are not limited thereto. The second selected species thus generated include the metal ions, the metalloid ions, the metal radicals, the metalloid radicals, or combinations thereof. In the case that the fin sidewalls 31 include a nitride-based material, the protection layer 34 may include titanium nitride (TiN), zirconium nitride (ZrN), hafnium nitride (HfN), boron nitride (BN), tantalum nitride (TaN), aluminum nitride (AlN), tungsten nitride (WN), yttrium nitride (YN), vanadium nitride (VN), niobium nitride (NbN), copper nitride ($Cu_3N$), or combinations thereof. In some embodiments, when the nitride-based material of the fin sidewalls 31 has a low nitrogen content, the second precursor gas may further include a nitrogen-bearing gas, for example, nitrogen ($N_2$), ammonia ($NH_3$), but is not limited thereto, so as to generate nitrogen plasma and/or nitrogen ions for facilitating formation of the protection layer 34 on each of the fin sidewalls 31. Other suitable nitrogen-bearing gases are within the contemplated scope of the present disclosure.

In some embodiments, the second precursor gas may have a gas flow rate less than that of the first precursor gas. In some embodiments, the first and second precursor gases may generate the first and second selected species under a plasma source power ranging from about 300 W to about 1200 W and a source power frequency of no less than about 13.56 MHz. In some embodiments, a carrier inert gas may be provided along with the first and second precursor gases so as to adjust the concentration of the first and second selected species in a reaction chamber for the plasma etching process. The carrier inert gas may include helium (He), argon (Ar), xenon (Xe), or combinations thereof.

Figure 14:
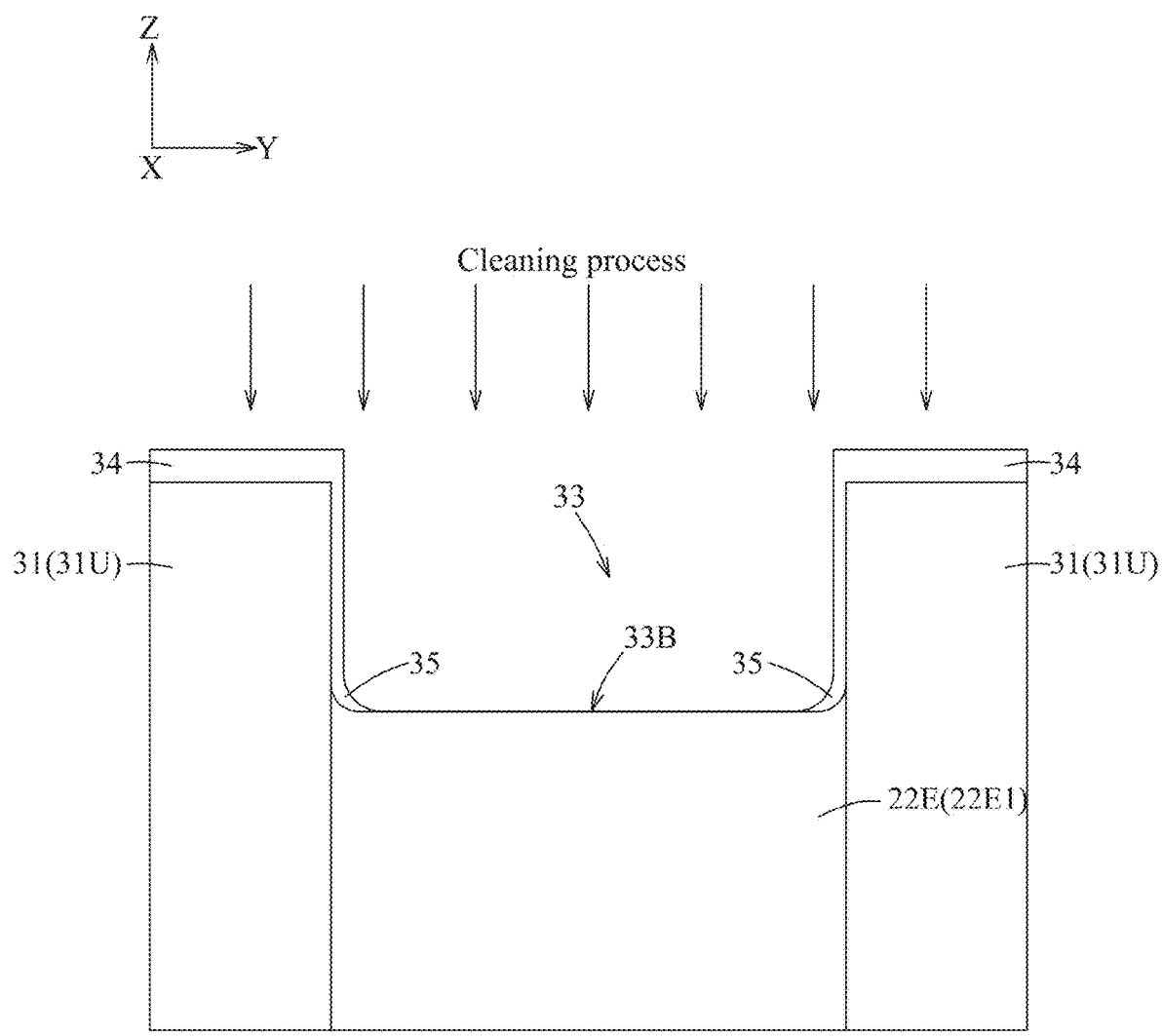
Figure 15:
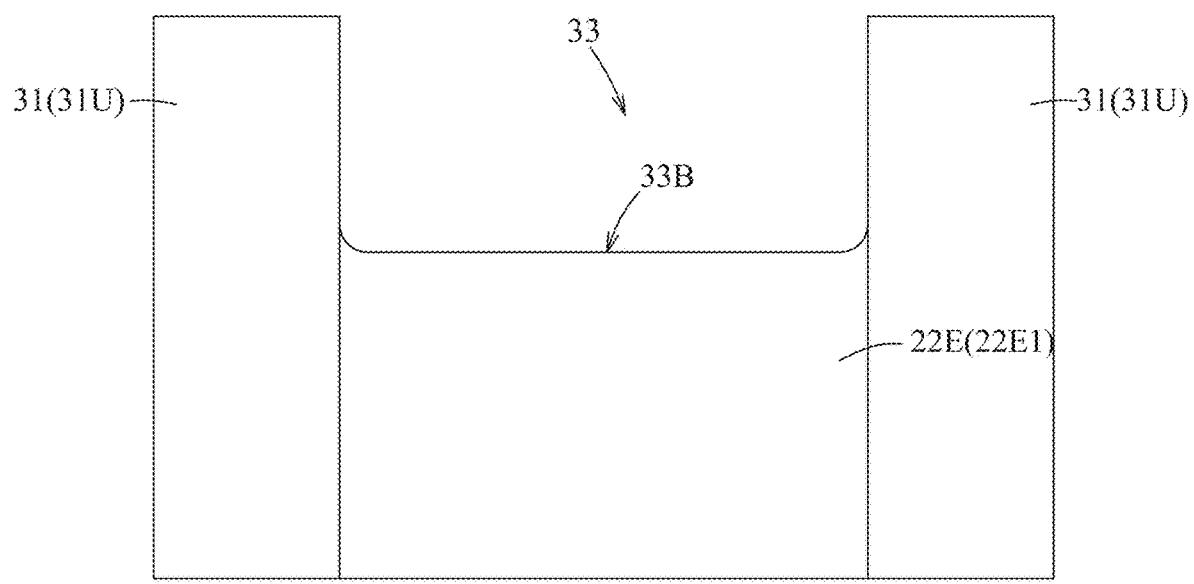

In sub-step S132, as shown in FIGS. 14 and 15, a cleaning process is performed so as to remove the protection layer 34 as well as the byproducts 35 and to widen a bottom 33B of the source/drain recess 33.

In some embodiments, the cleaning process is performed by an ion bombardment process. The ion bombardment process includes use of oxygen ions, inert ions, such as helium (He) ions, argon (Ar) ions, and xenon (Xe) ions, or combinations thereof. The oxygen ions may be produced by oxygen gas ($O_2$), and the inert ions may be produced from an inert gas, such as Ar, He, Xe, or combinations thereof, under a plasma source power ranging from about 300 W to about 1200 W and a source power frequency of no less than about 13.56 MHz. During the ion bombardment process, a bias voltage applied to the structure shown in FIG. 14 ranges from about 300 volts to about 1200 volts with a bias power frequency of no greater than 13.56 MHz, and thus the ions are able to physically bombard the structure so as to remove the protection layer 34 as well as the byproducts 35. In addition to physical bombardment, the oxygen ions may react with the byproducts 35 to form a volatile product, so that the byproducts 35 are able to naturally vaporize under a predetermined temperature.

After sub-step S132, as shown in FIG. 15, a remaining part of the exposed region 22E1 is completely exposed without being covered, which facilitates the etching process (i.e., another sub-step S131) to be subsequently performed. Additionally, the source/drain recess 33 on the remaining exposed region 22E1 thus formed may have a bottom 33B that is wide, and have a relatively straight profile. Furthermore, since the ions used in the cleaning process are less chemically reactive than the first and second species used in the etching process, the bottom 33B of the source/drain recess 33 on the remaining exposed region 22E1 may have a smooth surface (i.e., a flat etch front) with less damage.

In some embodiments, sub-steps S131 and S132 are executed repeatedly until each of the source/drain recesses 33 shown in FIGS. 10 and 11 has a predetermined depth. When each of the recesses 33 has the predetermined depth, the sacrificial layers 2221 of each of the semiconductor fins 22 (see FIG. 9) are patterned into patterned sacrificial layers 222A, the channel layers 2222 of each of the semiconductor fins 22 (see FIG. 9) are patterned into patterned channel layers 222B, and the lower portion 221 of each of the semiconductor fins 22 (see FIG. 9) is patterned into a patterned lower portion 221A. In addition, the bottom 33B of each of the source/drain recesses 33 may have a relatively small footing amount (FT) (see FIG. 10).

After each of the source/drain recesses 33 has the predetermined depth, as shown in FIG. 11, in some embodiments, with respect to the semiconductor substrate 20, the bottom 33B of each of the source/drain recesses 33 is located at a level lower than that of a lower surface of a bottommost one of the patterned sacrificial layers 222A of a corresponding one of the semiconductor fins 22 by a distance (D1) ranging from about 5 nm to about 20 nm. In some embodiments, as shown in FIG. 10, with respect to the semiconductor substrate 20, a top surface of each of the fin sidewalls 31 is located at a level higher than that of the lower surface of the bottommost one of the patterned sacrificial layers 222A of the corresponding semiconductor fin 22 (see FIG. 11) by a distance (D2) ranging from about 5 nm to about 60 nm. In some embodiments, as shown in FIG. 10, with respect to the semiconductor substrate 20, an uppermost point 33P on the bottom 33B of each of the source/drain recesses 33 has a height level not higher than the level of the lower surface of the bottommost one of the patterned sacrificial layers 222A (see FIG. 11), which is beneficial to a replacement gate process to be subsequently performed. In some embodiments, as shown in FIG. 10, each of the fin sidewalls 31 has a lower end 31E located at a first height level relative to the semiconductor substrate 20. During formation of the source/drain recesses 33, each of the isolation portions 24 is also etched back along surfaces of the fin sidewalls 31 to form a trench. A lowermost point 24P on an upper surface of each of the etched isolation portions 24 is located at a second height level relative to the semiconductor substrate 20. A difference (D3) between the first height level and the second height level ranges from about 0 nm to about 10 nm.

Figure 16:
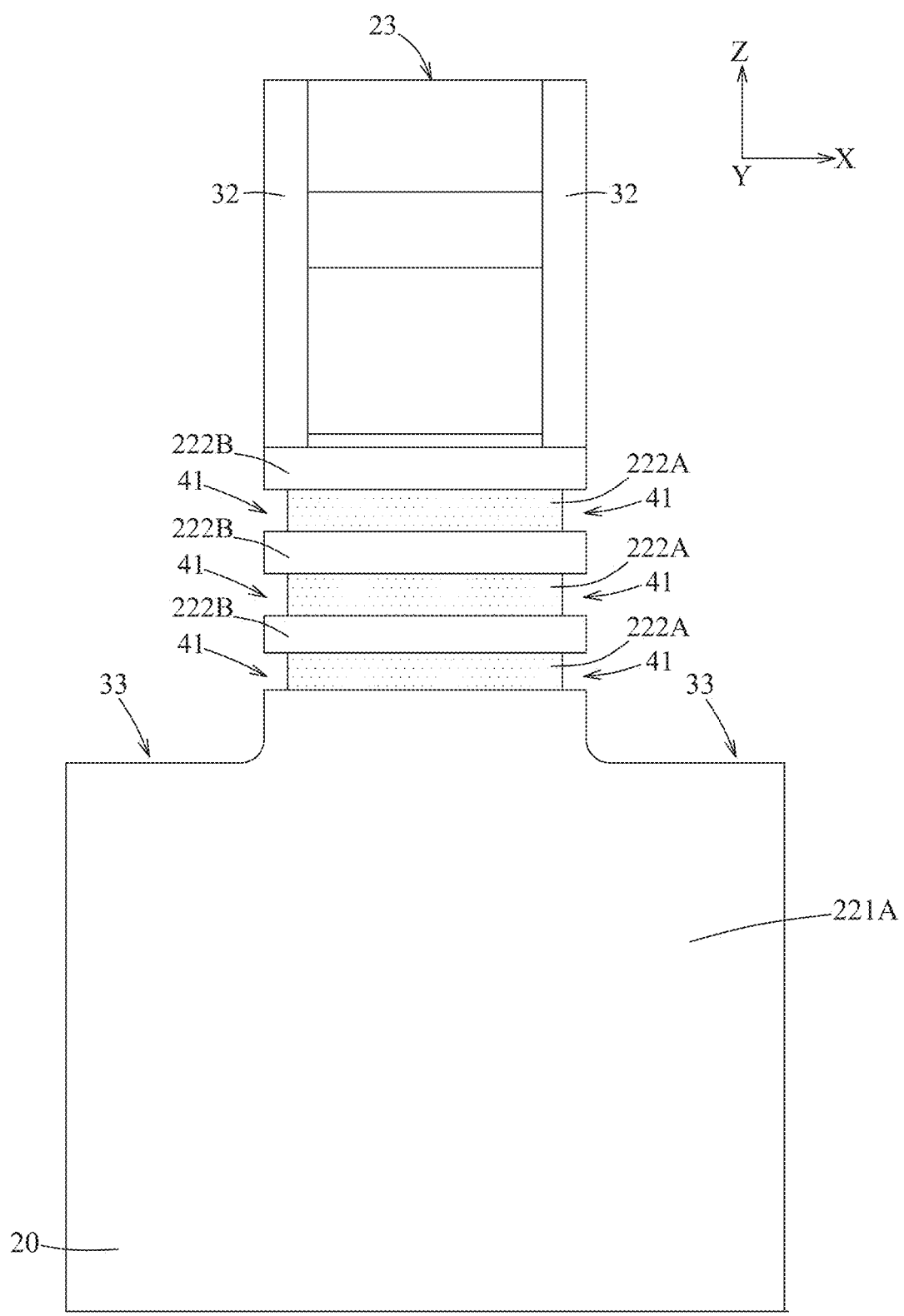

Referring to FIG. 1 and the examples illustrated in FIGS. 10 and 16, the method 10 proceeds to step S14, where a plurality of lateral recesses 41 are formed by respectively removing portions of the patterned sacrificial layers 222A shown in FIG. 11. FIG. 16 is a view similar to that of FIG. 11, but illustrating the structures after step S14, and the structure shown in FIG. 10 is substantially not changed after step S14. In some embodiments, the patterned sacrificial layers 222A are recesses by an isotropic etching process, such as wet etching, or other suitable etching techniques.

Figure 17:
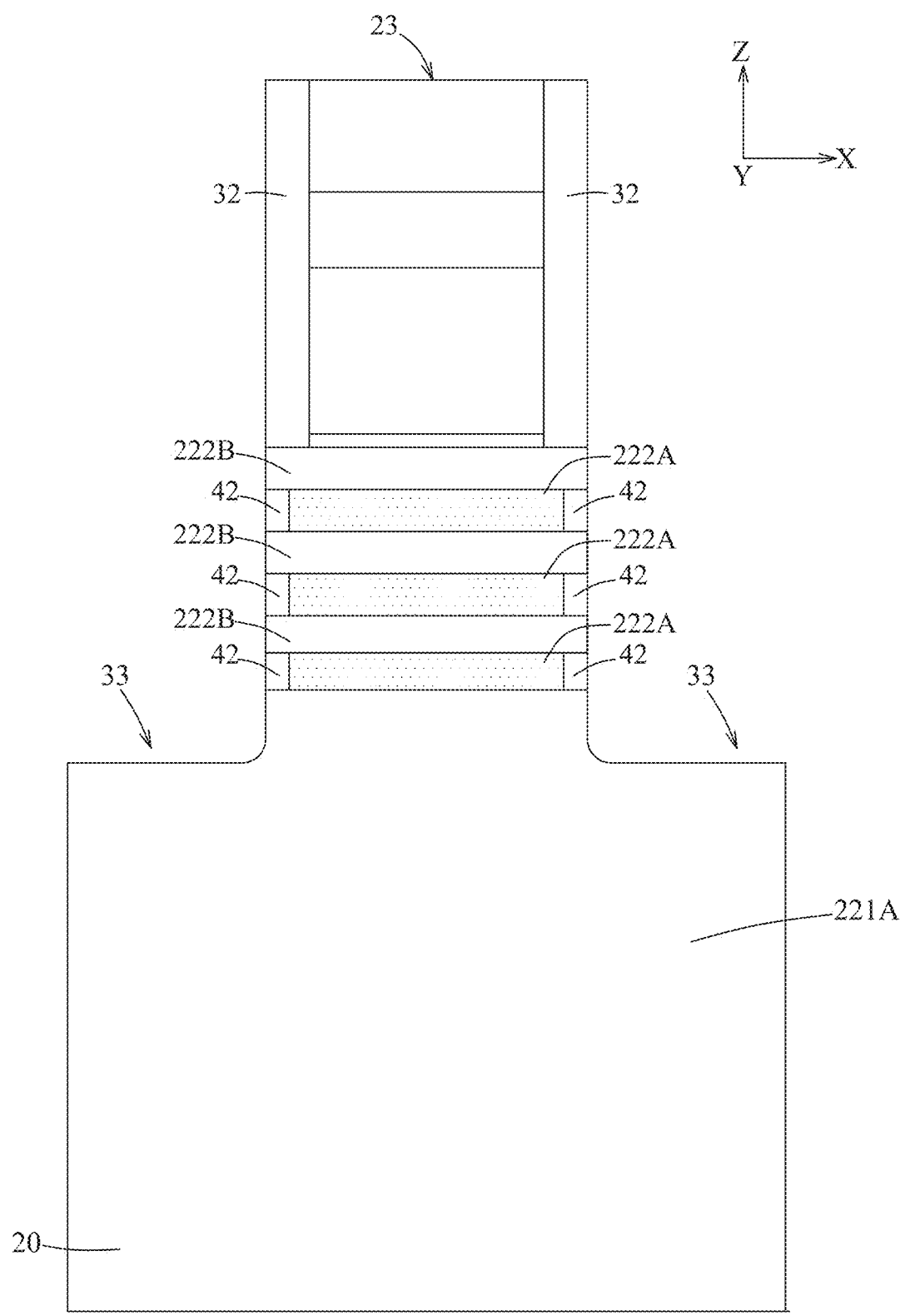

Referring to FIG. 1 and the examples illustrated in FIGS. 10 and 17, the method 10 proceeds to step S15, where a plurality of inner spacers 42 are formed in the lateral recesses 41, respectively, to cover the remaining portions of the patterned sacrificial layers 222A. FIG. 17 is a view similar to that of FIG. 16, but illustrating the structures after step S15, and the structure shown in FIG. 10 is substantially not changed after step S15. In some embodiments, step S15 includes: (i) depositing a spacer layer (not shown) on the structure shown in FIG. 16 to fill the lateral recesses 41 by CVD, ALD, or other suitable deposition techniques, and (ii) removing excess portions of the spacer layer by an etching process, for example, but not limited to, a wet etching process, a dry etching process, other suitable etching techniques, or combinations thereof, so as to form the inner spacers 42 in the lateral recesses 41. In some embodiments, the spacer layer include silicon oxide, silicon nitride, silicon oxynitride, other suitable dielectric materials, or combinations thereof. Other materials suitable for forming the spacer layer (i.e., materials for forming the inner spacers 42) are within the contemplated scope of the present disclosure.

Figure 18:
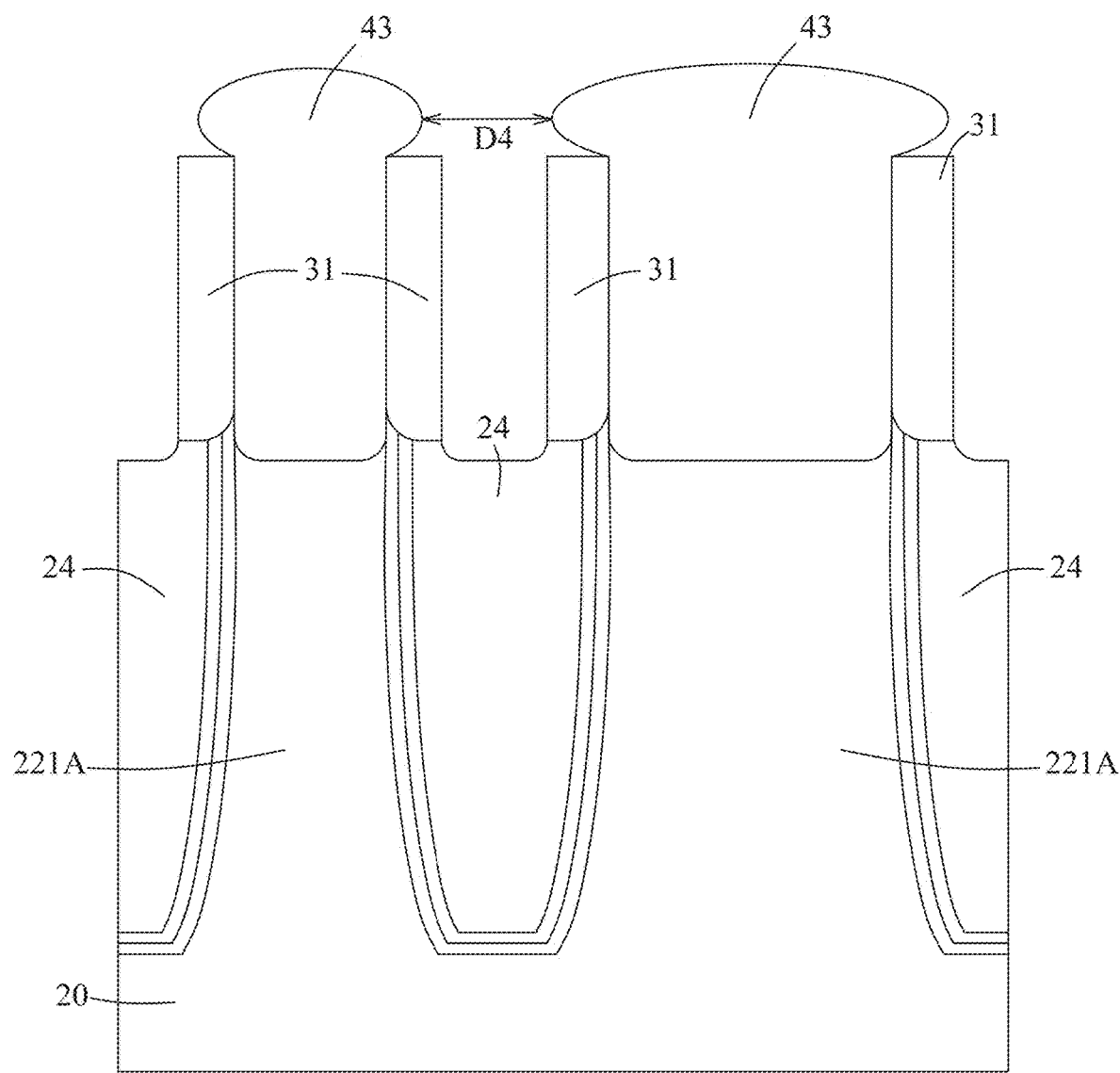
Figure 19:
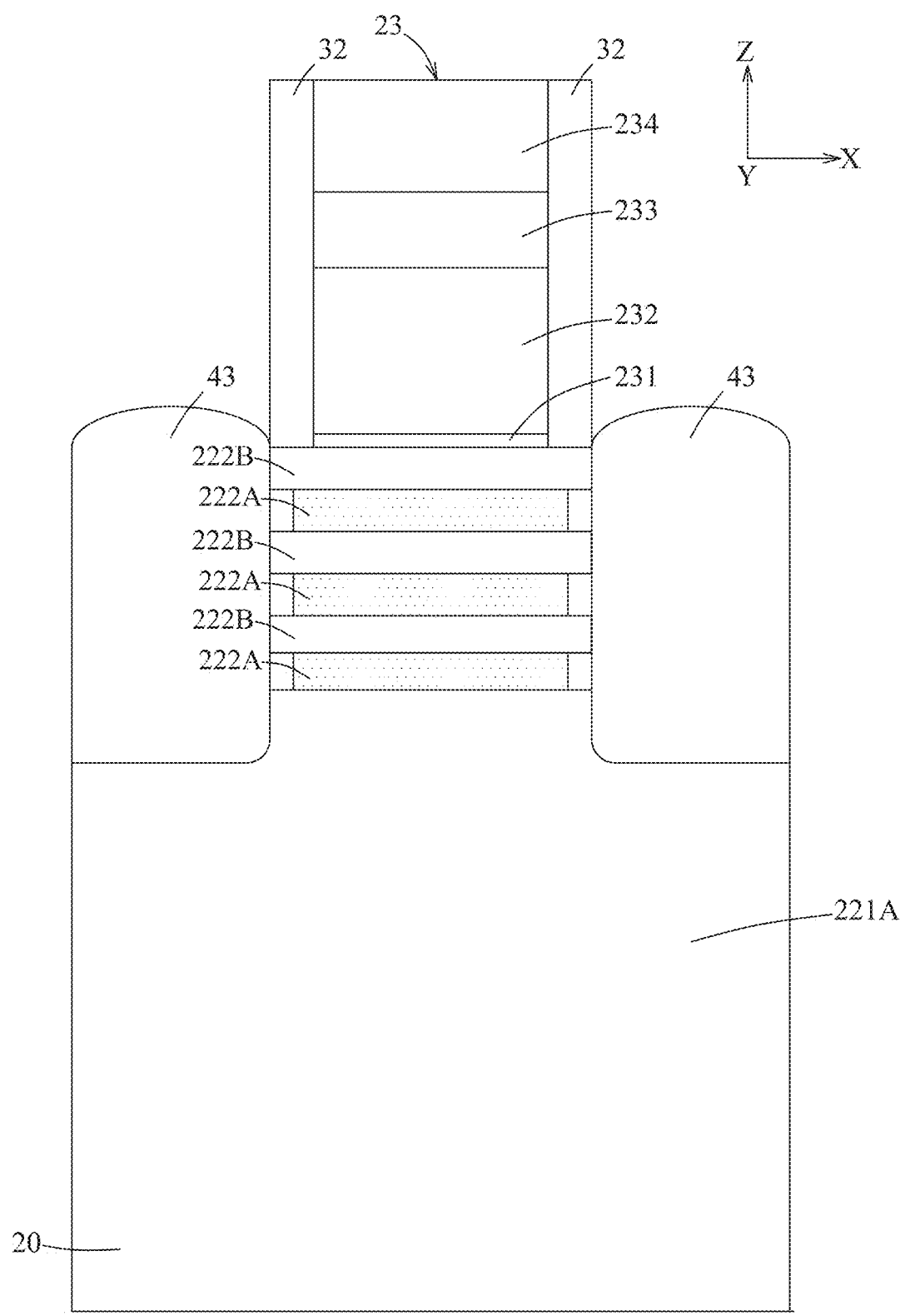

Referring to FIG. 1 and the examples illustrated in FIGS. 18 and 19, the method 10 proceeds to step S16, where source/drain portions 43 are formed in the source/drain recesses 33 (see FIG. 17) such that each of the patterned channel layers 222B extends between two corresponding adjacent ones of the source/drain portions 43. FIGS. 18 and 19 are views similar to those of FIGS. 10 and 17, respectively, but illustrating the structures after step S16. Since the fin sidewalls 31 are located at two opposite sides of each of the source/drain recesses 33 in the Y direction, the lateral growth of the source/drain portions 43 is limited until each of the source/drain portions 43 grows up to a level over the top surfaces of the two corresponding ones the fin sidewalls 31. Therefore, a distance (D4) between two adjacent ones of the source/drain portions 43 in the Y direction may be enlarged so that merging of the two adjacent source/drain portions 43 may be avoided. In some embodiments, when the distance (D2, see FIG. 10) between the top surface of each of the fin sidewalls 31 and the lower surface of the bottommost one of the patterned sacrificial layers 222A is great, the merging of the source/drain portions 43 is less likely to occur.

It is noted that the shape of each of the source/drain portions 43 depends on (i) the configuration of the fin sidewalls 31 at two opposite sides thereof, and (ii) the process(es) and the material(s) for forming the source/drain portions 43. In some embodiments, the source/drain portions 43 may be doped with an n-type impurity or a p-type impurity, and may be formed as a single layer structure or a multi-layered structure having several sub-layers with different doping concentration. In some embodiments, when one of the source/drain portions 43 has a p-type conductivity, the source/drain portion 43 may include single crystalline or polycrystalline silicon, single crystalline or polycrystalline silicon germanium, or other suitable materials doped with a p-type impurity so as to function as a source/drain of a p-FET. The p-type impurity may be, for example, but not limited to, boron (B), aluminum (Al), gallium (Ga), indium (In), other suitable materials, or combinations thereof. In some embodiments, when one of the source/drain portions 43 has an n-type conductivity, the source/drain portion 43 may include single crystalline silicon, polycrystalline silicon or other suitable materials doped with an n-type impurity so as to function as a source/drain of an n-FET. The n-type impurity may be, for example, but not limited to, nitrogen (N), phosphorous (P), arsenic (As), antimony (Sb), other suitable materials, or combinations thereof. It is noted that each of the source/drain portions 43 may refer to a source or a drain, individually or collectively dependent upon the context.

Figure 20:
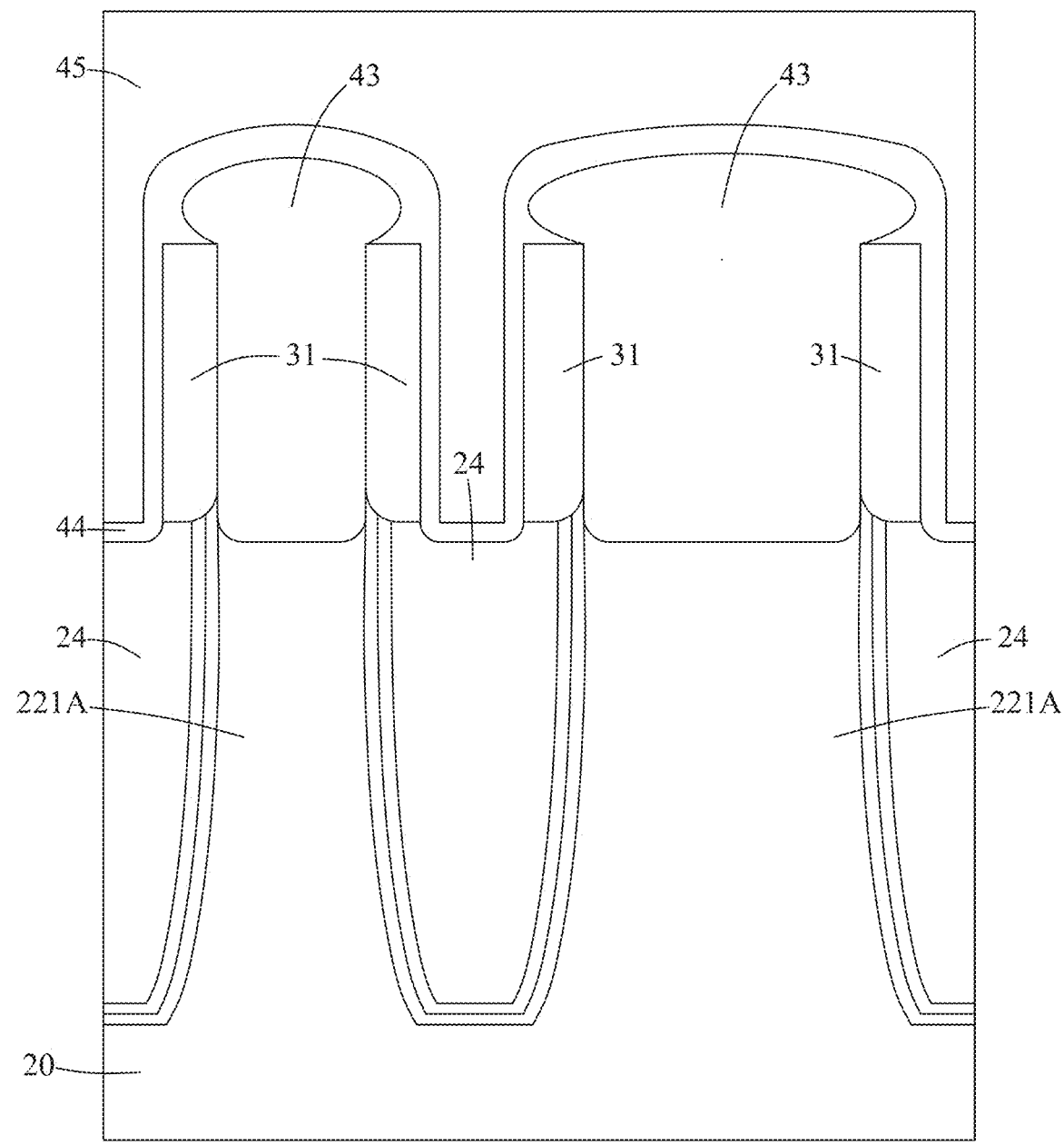
Figure 21:
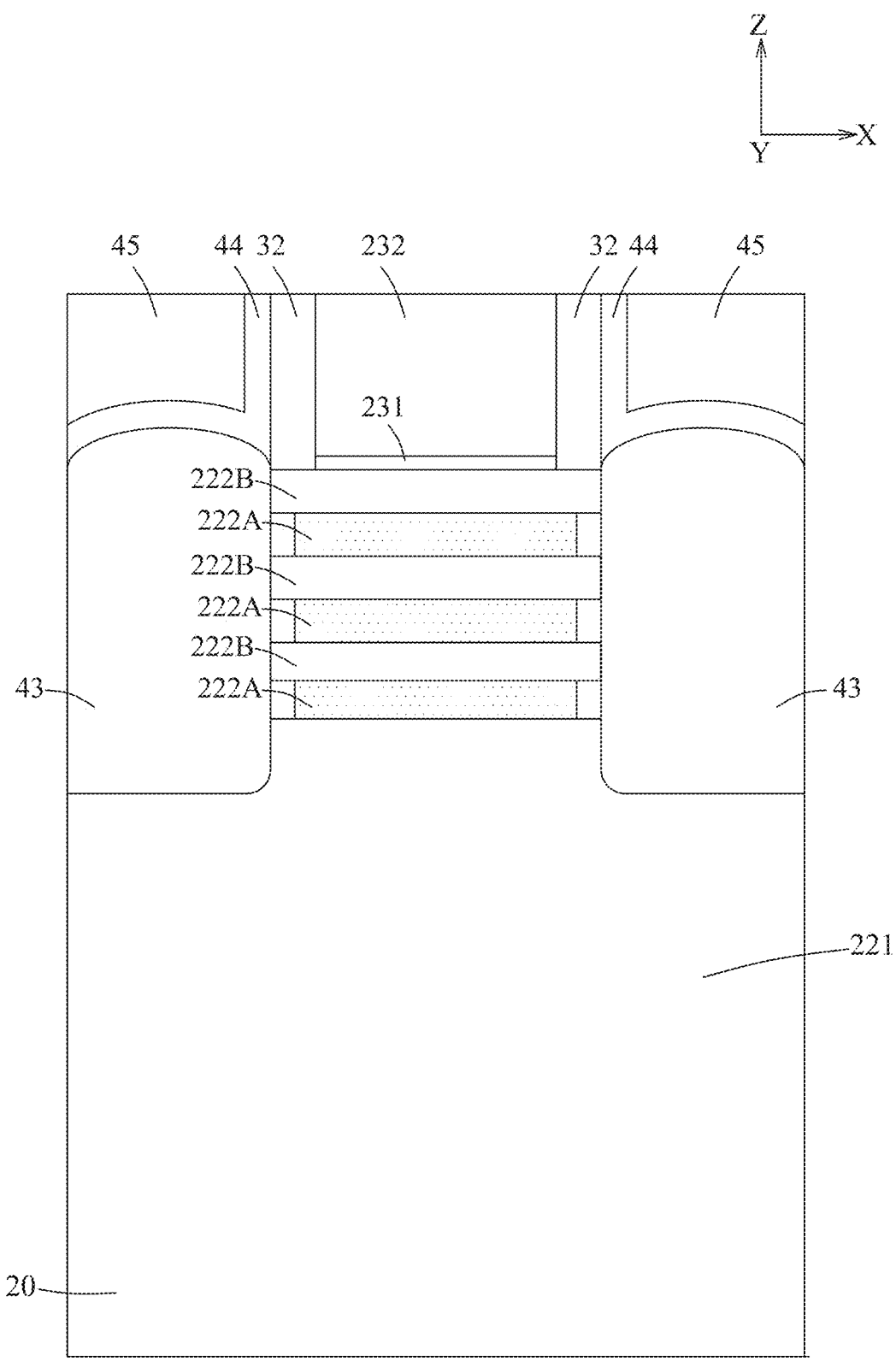

Referring to FIG. 1 and the examples illustrated in FIGS. 20 and 21, the method 10 proceeds to step S17, where a contact etch stop layer (CESL) 44 and an interlayer dielectric (ILD) layer 45 are sequentially formed over the structure shown in FIGS. 18 and 19. FIGS. 20 and 21 are views similar to those of FIGS. 18 and 19, respectively, but illustrating the structure after step S17. In some embodiments, step S17 is performed by sequentially depositing the CESL 44 and the ILD layer 45 using a blanket deposition process, such as, but not limited to, CVD, high density plasma CVD (HDPCVD), sub-atmospheric CVD (SACVD), or molecular layer deposition (MLD), followed by a planarization process, for example, but not limited to, CMP, thereby exposing the dummy gate electrode 232. In other words, the hard mask 234 and the polish stop layer 233 shown in FIG. 19 are removed after step S17. Other suitable processes for forming the CESL 150 and the ILD layer 151 are within the contemplated scope of the present disclosure. In some embodiments, the CESL 44 includes, for example, but not limited to, silicon nitride, carbon-doped silicon nitride, other suitable materials, or combinations thereof. The ILD layer 45 includes a dielectric material such as, but not limited to, silicon oxide, silicon nitride, silicon oxynitride, other suitable materials, or combinations thereof. Other suitable materials for forming the CESL 44 and the ILD layer 45 are within the contemplated scope of the present disclosure.

Referring to FIG. 1 and the examples illustrated in FIGS. 20, 22 and 23, the method 10 proceeds to step S18, where the replacement gate process is performed to replace the remnants of the dummy gate portion 23 (i.e., the dummy gate electrode 232 and the dummy gate dielectric layer 231) with a real gate portion 46 which includes a real gate electrode (not shown) and a real gate dielectric layer (not shown), thus forming the semiconductor devices 51. FIG. 22 is a top schematic view of the structure after step S18, and FIGS. 20 and 23 are sectional schematic views respectively taken along line C-C and line D-D of FIG. 22. FIG. 23 is a view similar to that of FIG. 21, but illustrating the structure after step S18, and the structure shown in FIG. 20 is substantially not changed after step S18. In some embodiments, step S18 includes: (i) removing the dummy gate electrode 232, the dummy gate dielectric layer 231, and the remaining portions of the patterned sacrificial layers 222A using a wet etching process or other suitable processes to form a cavity (not shown), (ii) sequentially depositing materials for forming the real gate dielectric layer and the real gate electrode so as to fill the cavity by a blanket deposition process, such as CVD, ALD or other suitable deposition techniques, and (iii) performing a planarization process, for example, but not limited to, CMP, to remove excesses of the real gate electrode and the real gate dielectric layer and to expose the CESL 44 and the ILD layer 45, thereby obtaining the real gate portion 46. Other suitable processes for forming the real gate portion 46 are within the contemplated scope of the present disclosure. In some embodiments, the real gate dielectric layer includes silicon oxide, silicon nitride, silicon oxynitride, high dielectric constant (k) materials, other suitable materials, or combinations thereof. In some embodiments, the real gate electrode may include at least one work function metal layer which is provided for adjusting threshold voltage of the semiconductor devices 51, and a metal filling layer which is provided for reduction of electrical resistivity of the real gate electrode. For example, the at least one work function metal may include titanium nitride (TiN), tantalum nitride (TaN), titanium aluminide (TiAl), titanium aluminum carbide (TiAlC), titanium aluminum carbon nitride (TiAlCN), or combinations thereof. The metal filling layer may include aluminum, tungsten, copper, other suitable materials, or combinations thereof. Other suitable materials for forming the real gate portion 46 are within the contemplated scope of the present disclosure.

In some embodiments, some steps in the method 10 may be modified, replaced, or eliminated without departure from the spirit and scope of the present disclosure. For example, the method 10 may further include an etching process performed between step S13 and step S14 so as to adjust the level of the top surface of each of the fin sidewalls 31 (i.e., reduce the distance (D2)) according to requirements of processes to be subsequently performed.

In this disclosure, with the introduction of the first precursor gas and the second precursor gas during the etching process for forming the source/drain recesses, selective removal of the exposed regions of each of the semiconductor fin with the fin sidewalls being substantially intact can be achieved. The high level of the fin sidewalls makes it possible to obtain any desired level of the fin sidewalls simply by further performing an additional etching process. Furthermore, by individually controlling the bias voltage during the etching process and the cleaning process, the bottom of the source/drain recess 33 may exhibit a flat etch front, and have a low footing amount, which can reduce defects that may occur in a GAA device. Therefore, the method in this disclosure provides a flexible strategy capable of obtaining the semiconductor devices with desired fin sidewalls, and achieving an improved yield rate of the thus manufactured semiconductor devices.

In accordance with some embodiments of the present disclosure, a method for manufacturing a semiconductor structure includes: forming a semiconductor portion which has an exposed region; forming two fin sidewalls which are disposed at two opposite sides of the exposed region of the semiconductor portion, and which include a dielectric material; and performing an etching process such that the exposed region of the semiconductor portion is etched away to form a recess while a protection layer is formed to protect each of the fin sidewalls during the etching process.

In accordance with some embodiments of the present disclosure, the dielectric material of the fin sidewalls is a nitride-based material, and the semiconductor portion includes a silicon-based material.

In accordance with some embodiments of the present disclosure, in the etching process, a first plasma is generated for removal of the exposed region and a second plasma is generated to selectively react with the fin sidewalls so as to form the protection layer on each of the fin sidewalls.

In accordance with some embodiments of the present disclosure, the method further includes performing a cleaning process after the etching process so as to remove the protection layer and to widen a bottom of the recess.

In accordance with some embodiments of the present disclosure, the etching process is performed using a plasma etching process, and the cleaning process is performed by an ion bombardment process.

In accordance with some embodiments of the present disclosure, a bias voltage applied to the semiconductor structure, during the ion bombardment process, ranges from 300 volt to 1200 volt, while the bias voltage applied to the semiconductor structure, during the plasma etching process, is zero.

In accordance with some embodiments of the present disclosure, the etching process and the cleaning process are repeated until the recess has a predetermined depth.

In accordance with some embodiments of the present disclosure, a method for manufacturing a semiconductor structure includes: forming a patterned structure which includes a semiconductor substrate, a semiconductor fin disposed on the semiconductor substrate, and a dummy gate portion disposed on the semiconductor fin such that the semiconductor fin has two regions exposed from the dummy gate portion; forming two fin sidewalls which are disposed at two opposite sides of each of the exposed regions of the semiconductor fin, and which include a nitride-based material; and performing an etching process such that the exposed regions of the semiconductor fin are etched away while a protection layer is formed to protect each of the fin sidewalls during the etching process.

In accordance with some embodiments of the present disclosure, a distance (D0) between the fin sidewalls ranges from 10 nm to 80 nm.

In accordance with some embodiments of the present disclosure, in the etching process, a first plasma is generated for removal of the exposed regions of the semiconductor fin, and a second plasma is generated to selectively react with the fin sidewalls so as to form the protection layer on each of the fin sidewalls.

In accordance with some embodiments of the present disclosure, a first precursor gas for generating the first plasma includes a fluorine (F)-bearing gas, chlorine (Cl)-bearing gas, bromine (Br)-bearing gas, or combinations thereof.

In accordance with some embodiments of the present disclosure, a second precursor gas for generating the second plasma includes metal halides, metalloid halides, transition metal alkyl complexes, transition metal alkyl halides, or combinations thereof.

In accordance with some embodiments of the present disclosure, the second precursor gas further includes nitrogen-bearing gas so as to facilitate formation of the protection layer on each of the fin sidewalls.

In accordance with some embodiments of the present disclosure, the second precursor gas further includes nitrogen ($N_2$), ammonia ($NH_3$), or a combination thereof so as to facilitate formation of the protection layer on each of the fin sidewalls.

In accordance with some embodiments of the present disclosure, a method for manufacturing a semiconductor structure includes: forming a patterned structure which includes a semiconductor substrate, a semiconductor fin including a stack portion and a lower portion which is disposed between the semiconductor substrate and the stack portion, the stack portion including a plurality of sacrificial layers and a plurality of channel layers disposed to alternate with the sacrificial layers, and a dummy gate portion disposed on the semiconductor fin such that the semiconductor fin has two regions exposed from the dummy gate portion; forming two fin sidewalls which are disposed at two opposite sides of each of the exposed regions of the semiconductor fin, and which include a nitride-based material, and performing an etching process such that the exposed regions of the semiconductor fin are etched away to form recesses, respectively, while a protection layer is formed to protect each of the fin sidewalls during the etching process.

In accordance with some embodiments of the present disclosure, the method further includes performing a cleaning process after the etching process so as to remove the protection layer and to widen a bottom of each of the recesses.

In accordance with some embodiments of the present disclosure, the etching process and the cleaning process are repeated until each of the recesses has a predetermined depth, and when each of the recesses has the predetermined depth, the sacrificial layers are patterned into patterned sacrificial layers and the channel layers are patterned into patterned channel layers.

In accordance with some embodiments of the present disclosure, with respect to the semiconductor substrate, a bottom of each of the recesses is located at a level lower than that of a lower surface of a bottommost one of the patterned sacrificial layers by a distance ranging from 5 nm to 20 nm when each of the recesses has the predetermined depth.

In accordance with some embodiments of the present disclosure, with respect to the semiconductor substrate, a top surface of each of the fin sidewalls is located at a level higher than that of a lower surface of a bottommost one of the patterned sacrificial layers by a distance ranging from 5 nm to 40 nm when each of the recesses has the predetermined depth.

In accordance with some embodiments of the present disclosure, the patterned structure further includes two isolation portions located respectively at two opposite sides of the lower portion of the semiconductor fin to permit the fin sidewalls to be respectively disposed on the isolation portions, and each of the fin sidewalls has a lower end located at a first height level relative to the semiconductor substrate. When each of the recesses has the predetermined depth, a lowermost point on an upper surface of each of the isolation portions is located at a second height level relative to the semiconductor substrate, and a difference between the first height level and the second height level ranges from 0 nm to 10 nm.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:
    forming a semiconductor portion which has an exposed region;
    forming two fin sidewalls which are disposed at two opposite sides of the exposed region of the semiconductor portion, and which include a dielectric material; and
    performing an etching process such that the exposed region of the semiconductor portion is etched away to form a recess while a protection layer is formed to protect each of the fin sidewalls during the etching process, the protection layer including titanium nitride, zirconium nitride, hafnium nitride, boron nitride, tantalum nitride, aluminum nitride, tungsten nitride, yttrium nitride, vanadium nitride, niobium nitride, copper nitride, or combinations thereof.

2. The method of claim 1, wherein the dielectric material of the fin sidewalls is a nitride-based material, and the semiconductor portion includes a silicon-based material.

3. The method of claim 1, wherein, in the etching process, a first plasma is generated for removal of the exposed region and a second plasma is generated to selectively react with the fin sidewalls so as to form the protection layer on each of the fin sidewalls.

4. The method of claim 1, further comprising:
    performing a cleaning process after the etching process so as to remove the protection layer and to widen a bottom of the recess.

5. The method of claim 4, wherein the etching process is performed using a plasma etching process, and the cleaning process is performed by an ion bombardment process.

6. The method of claim 5, wherein a bias voltage applied to the semiconductor structure, during the ion bombardment process, ranges from 300 volt to 1200 volt, while the bias voltage applied to the semiconductor structure, during the plasma etching process, is zero.

7. The method of claim 4, wherein the etching process and the cleaning process are repeated until the recess has a predetermined depth.

8. A method for manufacturing a semiconductor structure, comprising:
    forming a patterned structure which includes
        a semiconductor substrate,
        a semiconductor fin disposed on the semiconductor substrate, and
        a dummy gate portion disposed on the semiconductor fin such that the semiconductor fin has two regions exposed from the dummy gate portion;
    forming two fin sidewalls which are disposed at two opposite sides of each of the exposed regions of the semiconductor fin, and which include a nitride-based material; and
    performing an etching process such that the exposed regions of the semiconductor fin are etched away while a protection layer is formed to protect each of the fin sidewalls during the etching process, the protection layer including titanium nitride, zirconium nitride, hafnium nitride, boron nitride, tantalum nitride, aluminum nitride, tungsten nitride, yttrium nitride, vanadium nitride, niobium nitride, copper nitride, or combinations thereof.

9. The method of claim 8, wherein a distance between the fin sidewalls ranges from 10 nm to 80 nm.

10. The method of claim 8, wherein, in the etching process, a first plasma is generated for removal of the exposed regions of the semiconductor fin, and a second plasma is generated to selectively react with the fin sidewalls so as to form the protection layer on each of the fin sidewalls.

11. The method of claim 10, wherein a first precursor gas for generating the first plasma includes a fluorine (F)-bearing gas, chlorine (Cl)-bearing gas, bromine (Br)-bearing gas, or combinations thereof.

12. The method of claim 10, wherein a second precursor gas for generating the second plasma includes metal halides, metalloid halides, transition metal alkyl complexes, transition metal alkyl halides, or combinations thereof.

13. The method of claim 12, wherein the second precursor gas further includes nitrogen-bearing gas so as to facilitate formation of the protection layer on each of the fin sidewalls.

14. The method of claim 12, wherein the second precursor gas further includes nitrogen (N₂), ammonia (NH₃), or a combination thereof so as to facilitate formation of the protection layer on each of the fin sidewalls.

15. A method for manufacturing a semiconductor structure, comprising:
forming a patterned structure which includes
a semiconductor substrate,
a semiconductor fin including a stack portion and a lower portion which is disposed between the semiconductor substrate and the stack portion, the stack portion including a plurality of sacrificial layers and a plurality of channel layers disposed to alternate with the sacrificial layers, and
a dummy gate portion disposed on the semiconductor fin such that the semiconductor fin has two regions exposed from the dummy gate portion;
forming two fin sidewalls which are disposed at two opposite sides of each of the exposed regions of the semiconductor fin, and which include a nitride-based material; and
performing an etching process such that the exposed regions of the semiconductor fin are etched away to form recesses, respectively, while a protection layer is formed to protect each of the fin sidewalls during the etching process, the protection layer including titanium nitride, zirconium nitride, hafnium nitride, boron nitride, tantalum nitride, aluminum nitride, tungsten nitride, yttrium nitride, vanadium nitride, niobium nitride, copper nitride, or combinations thereof.

16. The method of claim 15, further comprising:
performing a cleaning process after the etching process so as to remove the protection layer and to widen a bottom of each of the recesses.

17. The method of claim 16, wherein:
the etching process and the cleaning process are repeated until each of the recesses has a predetermined depth; and
when each of the recesses has the predetermined depth, the sacrificial layers are patterned into patterned sacrificial layers and the channel layers are patterned into patterned channel layers.

18. The method of claim 17, wherein, with respect to the semiconductor substrate, a bottom of each of the recesses is located at a level lower than that of a lower surface of a bottommost one of the patterned sacrificial layers by a distance ranging from 5 nm to 20 nm when each of the recesses has the predetermined depth.

19. The method of claim 17, wherein, with respect to the semiconductor substrate, a top surface of each of the fin sidewalls is located at a level higher than that of a lower surface of a bottommost one of the patterned sacrificial layers by a distance ranging from 5 nm to 40 nm when each of the recesses has the predetermined depth.

20. The method of claim 17, wherein:
the patterned structure further includes two isolation portions located respectively at two opposite sides of the lower portion of the semiconductor fin to permit the fin sidewalls to be respectively disposed on the isolation portions, each of the fin sidewalls having a lower end located at a first height level relative to the semiconductor substrate;
when each of the recesses has the predetermined depth, a lowermost point on an upper surface of each of the isolation portions is located at a second height level relative to the semiconductor substrate; and
a difference between the first height level and the second height level ranges from 0 nm to 10 nm.

* * * * *